(12) United States Patent
Komiya

(10) Patent No.: US 10,804,285 B2
(45) Date of Patent: Oct. 13, 2020

(54) SEMICONDUCTOR DEVICE

(71) Applicant: TOSHIBA MEMORY CORPORATION, Tokyo (JP)

(72) Inventor: Ken Komiya, Nagoya Aichi (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 57 days.

(21) Appl. No.: 16/109,386

(22) Filed: Aug. 22, 2018

(65) Prior Publication Data

US 2019/0198521 A1 Jun. 27, 2019

(30) Foreign Application Priority Data

Dec. 26, 2017 (JP) .................................. 2017-249191

(51) Int. Cl.
| | | |
|---|---|---|
| H01L 27/11582 | (2017.01) | |
| H01L 27/11565 | (2017.01) | |
| H01L 23/528 | (2006.01) | |
| H01L 27/11519 | (2017.01) | |
| H01L 27/11556 | (2017.01) | |

(Continued)

(52) U.S. Cl.
CPC ...... *H01L 27/11582* (2013.01); *H01L 23/528* (2013.01); *H01L 27/1157* (2013.01); *H01L 27/11519* (2013.01); *H01L 27/11556* (2013.01); *H01L 27/11565* (2013.01); *H01L 29/1037* (2013.01); *H01L 21/0217* (2013.01); *H01L 21/02164* (2013.01); *H01L 21/02532* (2013.01); *H01L 21/02592* (2013.01); *H01L 21/02667* (2013.01); *H01L 21/31111* (2013.01); *H01L 21/31116* (2013.01); *H01L 21/31144* (2013.01); *H01L 23/5329* (2013.01); *H01L 23/53257* (2013.01); *H01L 29/40114* (2019.08); *H01L 29/40117* (2019.08); *H01L 29/513* (2013.01); *H01L 29/517* (2013.01); *H01L 29/7883* (2013.01); *H01L 29/7889* (2013.01); *H01L 29/7926* (2013.01)

(58) Field of Classification Search
None
See application file for complete search history.

(56) References Cited

U.S. PATENT DOCUMENTS

2010/0019310 A1* 1/2010 Sakamoto ......... H01L 27/11578
257/324

FOREIGN PATENT DOCUMENTS

JP 2010-034112 A 2/2010

* cited by examiner

*Primary Examiner* — Thien F Tran
(74) *Attorney, Agent, or Firm* — Kim & Stewart LLP

(57) ABSTRACT

A semiconductor device includes a first stacked body comprising first conductive layers and first insulating layers interposed therebetween, a first columnar portion comprising a first semiconductor layer extending in the first stacked body in the first direction and a first memory layer between the first semiconductor layer and the first conductive layers, a second stacked body comprising second conductive layers and second insulating layers interposed therebetween, and a second columnar portion comprising a second semiconductor layer extending in the second stacked body in the first direction and a second memory layer between the second semiconductor layer and the second conductive layers. The first columnar portion has a first diameter, and the second columnar portion has a second diameter, and each of the plurality of first conductive layers has a first film thickness, and each of the plurality of second conductive layers has a second film thickness.

20 Claims, 22 Drawing Sheets

(51) Int. Cl.
*H01L 29/10* (2006.01)
*H01L 27/1157* (2017.01)
*H01L 21/02* (2006.01)
*H01L 23/532* (2006.01)
*H01L 29/788* (2006.01)
*H01L 29/792* (2006.01)
*H01L 29/51* (2006.01)
*H01L 21/311* (2006.01)
*H01L 21/28* (2006.01)

SEMICONDUCTOR DEVICE

CROSS-REFERENCE TO RELATED APPLICATION

This application is based upon and claims the benefit of priority from Japanese Patent Application No. 2017-249191, filed, Dec. 26, 2017, the entire contents of which are incorporated herein by reference.

FIELD

Embodiments described herein relate generally to a semiconductor device.

BACKGROUND

NAND-type flash memories are known in which memory cells are three-dimensionally arranged.

DETAILED DESCRIPTION

Figure 1:
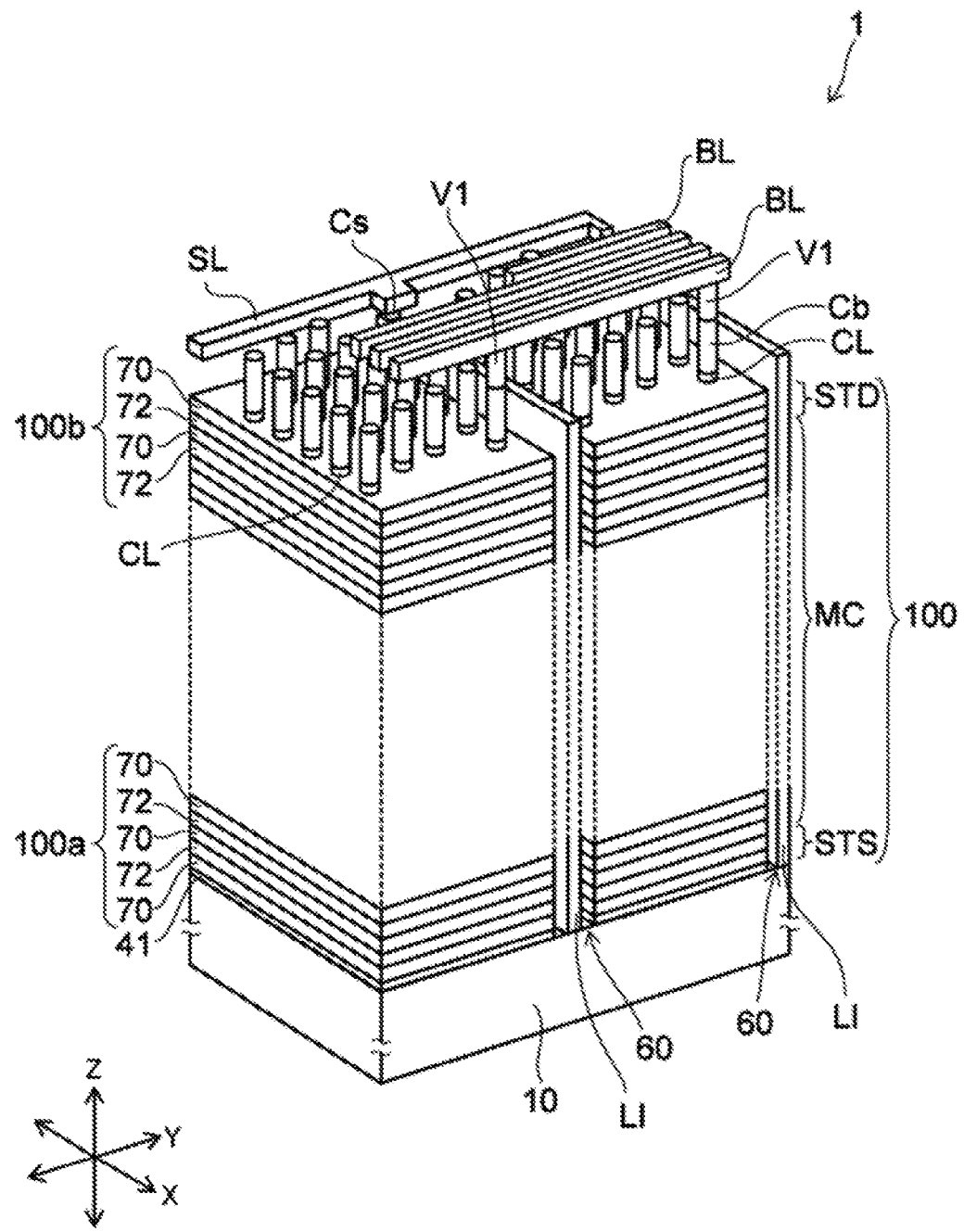
FIG. 1 is a perspective view illustrating a memory cell array in a semiconductor device according to a first embodiment.

Embodiments provide a semiconductor device that reduces a fluctuation of a memory cell characteristic.

In general, according to one embodiment, a semiconductor device includes an under layer, a first stacked body located over the under layer, comprising a plurality of first conductive layers stacked one over the other in a first direction away from the under layer with first insulating layers interposed therebetween, a first columnar portion comprising a first semiconductor layer extending in the first direction, and a first memory layer located between the first semiconductor layer and the plurality of first conductive layers, a second stacked body located over the first stacked body, and comprising a plurality of second conductive layers stacked one over the other in the first direction with second insulating layers interposed therebetween, and a second columnar portion comprising a second semiconductor layer extending in the second stacked body in the first direction, and a second memory layer located between the second semiconductor layer and the plurality of second conductive layers. The first columnar portion has a first diameter, and the second columnar portion has a second diameter different from the first diameter, and each of the plurality of first conductive layers has a first film thickness, and each of the plurality of second conductive layers has a second film thickness different from the first film thickness.

Hereinafter, the embodiment will be described with reference to the drawings. In the drawings, the same portions are denoted by the same reference numerals.

First Embodiment

Hereinafter, a semiconductor device according to a first embodiment will be described with reference to FIGS. 1 to 19. Here, as the semiconductor device, a three-dimensional stacked NAND-type flash memory is described as an example.

Structure of First Embodiment

FIG. 1 is a perspective view illustrating a memory cell array 1 in the semiconductor device according to the first embodiment.

In FIG. 1, two directions, which are parallel to a main surface of a substrate 10 and perpendicular to each other, are defined as an X direction and a Y direction. A direction perpendicular to the X direction and the Y direction is defined as a Z direction (a stacking direction).

As illustrated in FIG. 1, the memory cell array 1 includes the substrate 10 as an under layer, a stacked body 100 (a first stacked body 100a and a second stacked body 100b) provided over the upper surface of the substrate 10, a plurality of columnar portions CL, a plurality of dividing sections 60, and an upper layer wiring provided over the stacked body 100. In FIG. 1, as the upper layer wiring, for example, a bit line BL and a source line SL are illustrated.

The columnar portion CL is formed in a substantially columnar shape extending in the stacking direction (the Z direction) within the stacked body 100. The plurality of columnar portions CL are arranged in, for example, a zigzag pattern in the X direction-Y direction plane. Alternatively, the plurality of columnar portions CL may be arranged in a square lattice pattern in the X direction-Y direction plane.

The dividing sections 60 separate the stacked body 100 into a plurality of blocks (or finger portions) in the Y direction. The dividing section 60 includes a wiring portion LI extending in the X direction and the Z direction. Although not illustrated, an insulating layer is provided between the wiring portion LI and the stacked body 100.

The plurality of bit lines BL and the source line SL are provided over the stacked body 100. The plurality of bit lines BL and the source line SL are, for example, metal layers, and each extends in the Y direction. The plurality of bit lines BL are spaced from each other in the X direction.

The upper end portion of a semiconductor layer 20 (to be described below) in the columnar portion CL is connected to the bit line BL via a contact Cb and a contact V1.

A plurality of the columnar portions CL are connected to a common bit line BL. The plurality of columnar portions CL connected to the common bit line BL include columnar portions CL underlying each common bit line in the individual blocks separated by the dividing sections 60 in the Y direction.

The wiring portion LI is connected to the source line SL via a contact Cs.

Figure 2:
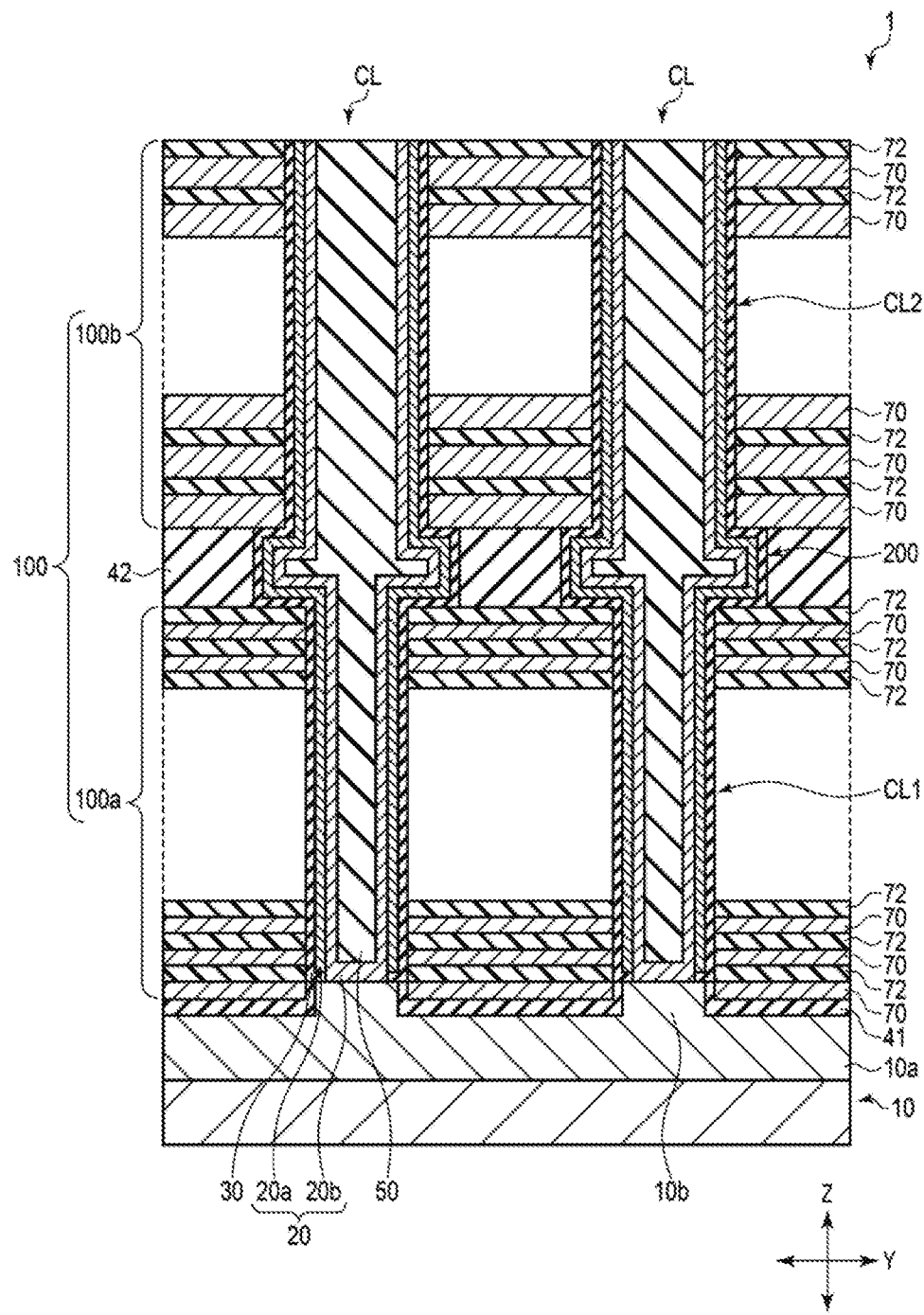
FIG. 2 is a sectional view illustrating the memory cell array in the semiconductor device according to the first embodiment.

FIG. 2 is a sectional view illustrating the memory cell array 1 in the semiconductor device according to the first embodiment.

As illustrated in FIG. 2, the substrate 10 includes a first portion 10a and a second portion 10b. The substrate 10 is a semiconductor substrate, and is, for example, a silicon substrate mainly containing silicon.

The first portion 10a is a P-type silicon region (P-type well) provided at the surface side of the substrate 10. The second portion 10b protrudes upwardly from the upper surface of the first portion 10a. The second portion 10b is provided under the columnar portion CL, and is provided in a columnar shape to correspond to the shape of the columnar portion CL in the X direction-Y direction plane.

As described below, the second portion 10b is a crystal layer epitaxially grown from the first portion 10a. The first portion 10a and the second portion 10b form an integrated single crystal region, and have substantially the same crystal orientation. Like the first portion 10a, the second portion 10b is a P-type silicon region. Each of the first portion 10a and the second portion 10b contains, for example, boron as P-type impurities(i.e., dopants) therein.

An insulating layer 41 is provided on the first portion 10a and around the second portion 10b.

The stacked body 100 includes the first stacked body 100a, the second stacked body 100b, and an intermediate layer 42 provided between the first stacked body 100a and the second stacked body 100b.

The first stacked body 100a is provided over the insulating layer 41 on the substrate 10. The first stacked body 100a includes a plurality of conductive layers 70 and a plurality of insulating layers 72. The plurality of conductive layers 70 are stacked one over the other in the Z direction perpendicular to the main surface of the substrate 10 with the insulating layers (insulator) 72 interposed therebetween. That is, the plurality of conductive layers 70 and the plurality of insulating layers 72 are stacked alternately.

The second stacked body 100b is provided on the first stacked body 100a via the intermediate layer 42. Like the first stacked body 100a, the second stacked body 100b includes the plurality of conductive layers 70 and the plurality of insulating layers 72. The plurality of conductive layers 70 are stacked in the Z direction with the insulating layers 72 interposed therebetween.

The conductive layer 70 is, for example, a metal layer. The conductive layer 70 is, for example, a tungsten layer containing tungsten as a main component, or a molybdenum layer containing molybdenum as a main component. The insulating layer 72 is, for example, a silicon oxide layer containing silicon oxide as a main component thereof.

Like the insulating layer 72, the intermediate layer 42 is, for example, a silicon oxide layer containing silicon oxide as a main component. The film thickness of the intermediate layer 42 is larger than the film thickness of one conductive layer 70 in the first stacked body 100a, the film thickness of one conductive layer 70 in the second stacked body 100b, and the film thickness of one insulating layer 72.

The columnar portion CL includes a first columnar portion CL1, a second columnar portion CL2, and a joining portion 200.

The first columnar portion CL1 extends inside the first stacked body 100a in the stacking direction (the Z direction). The second columnar portion CL2 extends inside the second stacked body 100b in the stacking direction. The joining portion 200 is provided between the first columnar portion CL1 and the second columnar portion CL2 within the intermediate layer 42. The joining portion 200 joins the first columnar portion CL1 to the second columnar portion CL2 and is continuous from the first columnar portion CL1 and the second columnar portion CL2. The diameter of the joint portion 200 is larger than the diameter of the first columnar portion CL1 and the diameter of the second columnar portion CL2.

The diameter of the first columnar portion CL1 is smaller than the diameter of the second columnar portion CL2. The film thickness of the conductive layer 70 in the first stacked body 100a is smaller than the film thickness of the conductive layer 70 in the second stacked body 100b. Details of these diameters and film thicknesses will be described below with reference to FIGS. 3 and 4.

The first columnar portion CL1 includes a core layer 50, the semiconductor layer 20, and a memory layer 30 which are provided in that order from the center. Like the first columnar portion CL1, the second columnar portion CL2 includes the core layer 50, the semiconductor layer 20, and the memory layer 30 which are provided in that order from the center. Like the first columnar portion CL1, the joining portion 200 includes the core layer 50, the semiconductor layer 20, and the memory layer 30 which are provided in that order from the center.

The core layer 50 is provided as a central portion in the first columnar portion CL1, the second columnar portion CL2, and the joining portion 200. The core layer 50 continuously extends in the stacking direction in the first columnar portion CL1, the second columnar portion CL2, and the joining portion 200. Here, the diameter of the core layer 50 in the first columnar portion CL1 is smaller than the diameter of the core layer 50 in the second columnar portion CL2. The diameter of the core layer 50 in the joining portion 200 is larger than the diameter of the core layer 50 in the first columnar portion CL1 and the second columnar portion CL2.

The semiconductor layer 20 is provided around the core layer 50 in the first columnar portion CL1, the second columnar portion CL2, and the joining portion 200. That is, the semiconductor layer 20 is provided between the core layer 50 and the memory layer 30. The semiconductor layer 20 continuously extends in the stacking direction in the first columnar portion CL1, the second columnar portion CL2, and the joining portion 200. Thus, the diameter (inner diameter and outer diameter) of the semiconductor layer 20 in the first columnar portion CL1 is smaller than the inner diameter and the outer diameter of the semiconductor layer 20 in the second columnar portion CL2. The inner diameter and the outer diameter of the semiconductor layer 20 in the joining portion 200 are larger than the inner diameter and the outer diameter of the semiconductor layer 20 in the first columnar portion CL1 and the second columnar portion CL2.

The semiconductor layer 20 includes a body layer 20b, and a cover layer 20a provided around the body layer 20b. The lower end of the body layer 20b is connected to the second portion 10b of the substrate 10.

The memory layer 30 is provided around the semiconductor layer 20 in the first columnar portion CL1, the second columnar portion CL2, and the joining portion 200. That is, the memory layer 30 is provided between the semiconductor layer 20 and the stacked body 100. The memory layer 30 continuously extends in the stacking direction in the first columnar portion CL1, the second columnar portion CL2, and the joining portion 200. Thus, the diameter (inner diameter and outer diameter) of the memory layer 30 in the first columnar portion CL1 is smaller than the inner diameter and the outer diameter of the memory layer 30 in the second columnar portion CL2. The inner diameter and the outer diameter of the memory layer 30 in the joining portion 200 are larger than the inner diameter and the outer diameter of the memory layer 30 in the first columnar portion CL1 and the second columnar portion CL2. The memory layer 30 is a layer that does not perform a data storing function in the joining portion 200.

Figure 3:
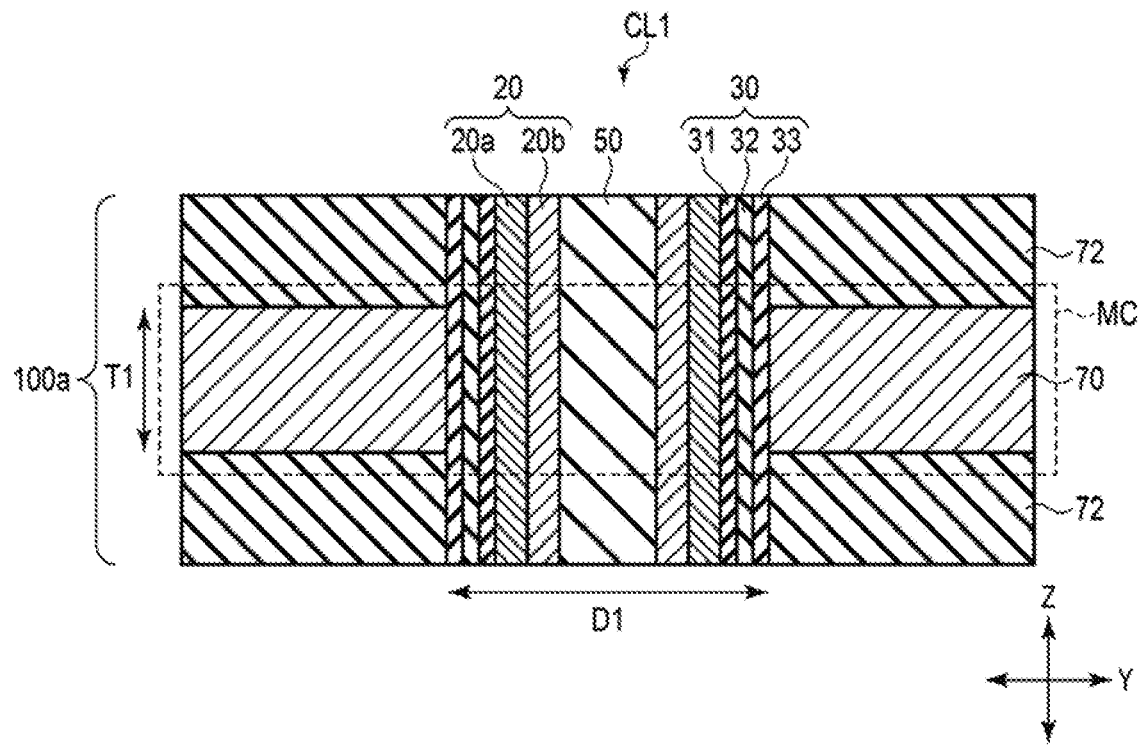
FIG. 3 is a sectional view illustrating a part of a first stacked body and a first columnar portion in the semiconductor device according to the first embodiment, in an enlarged scale.
Figure 4:
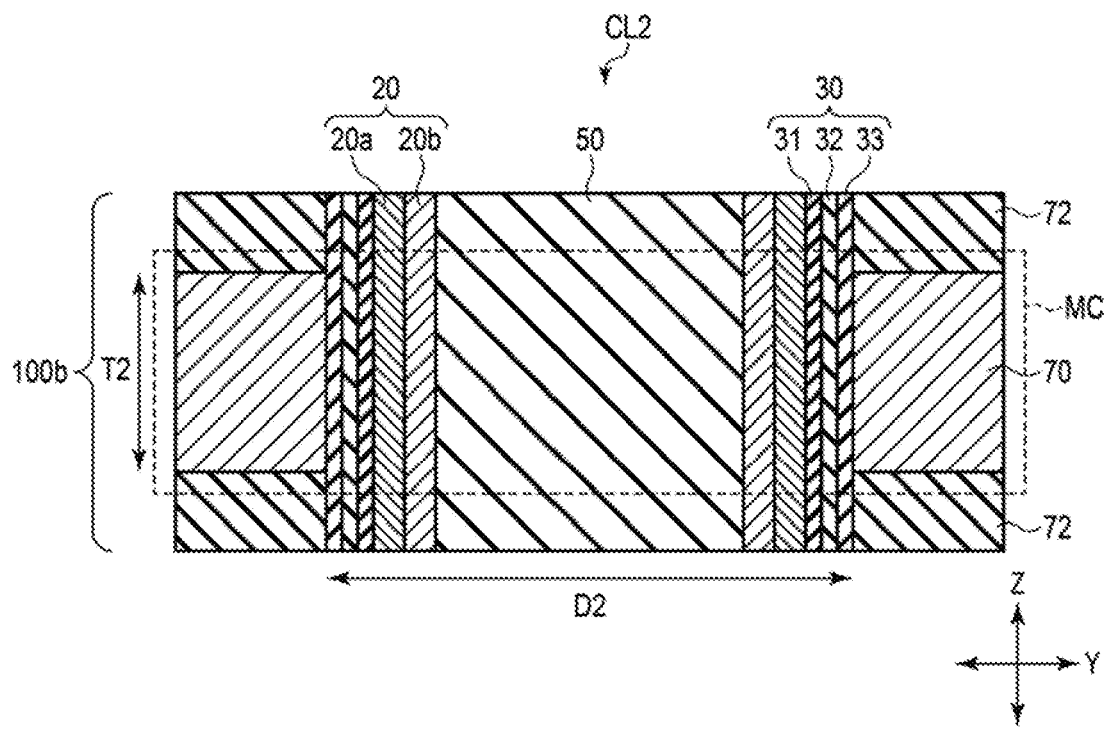
FIG. 4 is a sectional view illustrating a part of a second stacked body and a second columnar portion in the semiconductor device according to the first embodiment, in an enlarged scale.

FIG. 3 is a sectional view illustrating a part of the first stacked body 100a and the first columnar portion CL1 in the semiconductor device according to the first embodiment, in an enlarged scale. FIG. 4 is a sectional view illustrating a part of the second stacked body 100b and the second columnar portion CL2 in the semiconductor device according to the first embodiment, in an enlarged scale.

As illustrated in FIGS. 3 and 4, the memory layer 30 includes a tunnel insulating layer 31, a charge storage layer 32, and a block insulating layer 33.

The tunnel insulating layer 31 is provided between the semiconductor layer 20 and the charge storage layer 32. The charge storage layer 32 is provided between the tunnel insulating layer 31 and the block insulating layer 33. The block insulating layer 33 is provided between the charge storage layer 32 and the conductive layer 70 (and the insulating layer 72).

The semiconductor layer 20, the memory layer 30, and the conductive layer 70 constitute a memory cell MC. The memory cell MC has a vertical transistor structure in which the semiconductor layer 20 is surrounded by the conductive layer 70 via the memory layer 30. In each of the first stacked body 100a and the second stacked body 100b, a plurality of memory cells MC are provided in the Z direction. In the intermediate layer 42, the memory cells MC are not provided.

In the memory cell MC having a vertical transistor structure, the semiconductor layer 20 functions as a channel, and the conductive layer 70 functions as a control gate (a word line). The charge storage layer 32 functions as a data storage layer in which charges injected from the semiconductor layer 20 are accumulated.

The memory cell MC is, for example, a charge trapping-type memory cell. The charge storage layer 32 includes a large number of trapping sites which trap charges in an insulating layer, and includes, for example, a silicon nitride layer. Otherwise, the charge storage layer 32 may be a conductive floating gate which is surrounded by an insulator.

The tunnel insulating layer 31 becomes a potential barrier when charges are injected from the semiconductor layer 20 to the charge storage layer 32, or when charges accumulated in the charge storage layer 32 are released to the semiconductor layer 20. The tunnel insulating layer 31 includes, for example, a silicon oxide layer.

The block insulating layer 33 prevents charges accumulated in the charge storage layer 32 from being released into the conductive layer 70. The block insulating layer 33 prevents back tunneling of charges from the conductive layer 70 to the first columnar portion CL1 and the second columnar portion CL2.

The block insulating layer 33 includes, for example, a silicon oxide layer. The block insulating layer 33 may have a structure in which a silicon oxide layer and a metal oxide layer are provided one over the other. In this case, the silicon oxide layer is provided between the charge storage layer 32 and the metal oxide layer, and the metal oxide layer is provided between the silicon oxide layer and the conductive layer 70. As the metal oxide layer, for example, an aluminum oxide layer, a zirconium oxide layer, and a hafnium oxide layer may be exemplified.

Here, the first columnar portion CL1 has a diameter D1 as a dimension along the Y direction. Meanwhile, the second columnar portion CL2 has a diameter D2 larger than the diameter D1. That is, the available channel volume of a memory cell MC in the first columnar portion CL1 is smaller than the available channel volume of a memory cell MC in the second columnar portion CL2.

The conductive layer 70 in the first stacked body 100a has a film thickness T1 as a dimension along the Z direction. Meanwhile, the conductive layer 70 in the second stacked body 100b has a film thickness T2 larger than the film thickness T1. Therefore the length of the portion of the semiconductor layer 20 which forms a channel of a memory cell MC in the first columnar portion CL1 is smaller than length of the portion of the semiconductor layer 20 which forms a channel of a memory cell MC in the second columnar portion CL2.

When a channel volume and a channel length are adjusted in this manner, a coupling ratio of the memory cell MC in the first columnar portion CL1 and a coupling ratio of the memory cell MC in the second columnar portion CL2 are adjusted to be the same.

Again, as illustrated in FIG. 1, a drain-side select transistor STD is provided at the upper layer portion of the second stacked body 100b. A source-side select transistor STS is provided at the lower layer portion of the first stacked body 100a.

Among the plurality of conductive layers 70 of the second stacked body 100b, at least the uppermost conductive layer 70 functions as a control gate of the drain-side select transistor STD. Among the plurality of conductive layers 70 of the first stacked body 100a, at least the lowermost conductive layer 70 functions as a control gate of the source-side select transistor STS. The second portion 10b of the substrate 10 becomes a channel of the source-side select transistor STS.

A plurality of memory cells MC are provided between the drain-side select transistor STD and the source-side select transistor STS. The plurality of memory cells MC, the drain-side select transistor STD, and the source-side select transistor STS are connected in series through the semiconductor layer 20 of the columnar portion CL to constitute one memory string. The memory strings are arranged in, for example, zigzags in a plane direction parallel to the XY plane such that the plurality of memory cells MC are three-dimensionally provided in the X direction, the Y direction, and the Z direction.

Manufacturing Method of First Embodiment

FIGS. 5 to 18 are sectional views illustrating a manufacturing process of the memory cell array 1 in the semiconductor device according to the first embodiment.

Figure 5:
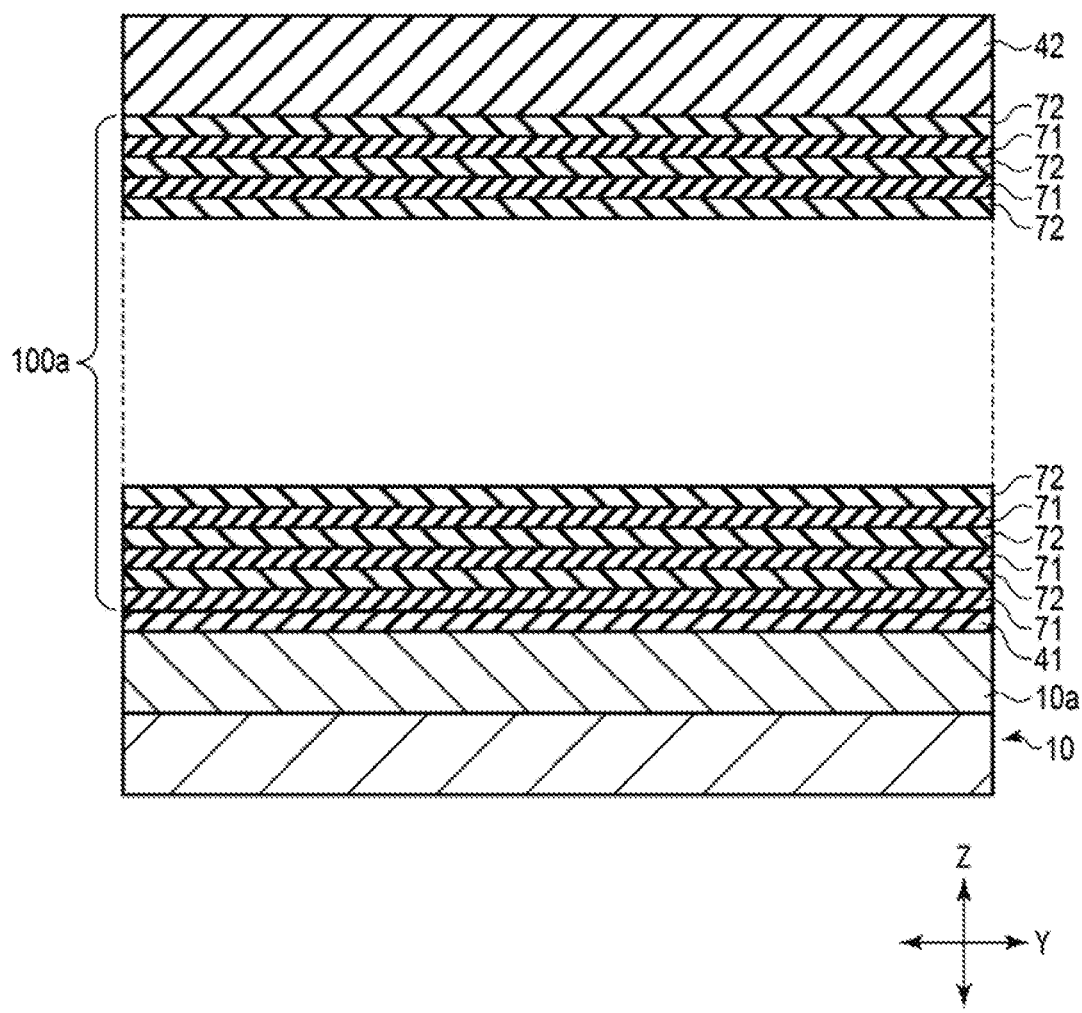
FIG. 5 is a sectional view illustrating a manufacturing process of the memory cell array in the semiconductor device according to the first embodiment.

First, as illustrated in FIG. 5, the insulating layer 41 is formed on the first portion 10a of the substrate 10. On the insulating layer 41, a sacrificial layer 71 as a first layer and the insulating layer 72 as a second layer are alternately stacked. A process of alternately stacking the sacrificial layer 71 and the insulating layer 72 is repeated to form the first stacked body 100a including the plurality of sacrificial layers 71 and the plurality of insulating layers 72, on the substrate 10. Here, the sacrificial layer 71 is formed to have a film thickness T1.

The intermediate layer 42 is formed on the first stacked body 100a. The film thickness of the intermediate layer 42 is larger than the film thickness of one sacrificial layer 71 in the first stacked body 100a, and the film thickness of the intermediate layer 42 is larger than the film thickness of one insulating layer 72 in the first stacked body 100a.

For example, the sacrificial layer 71 is a silicon nitride layer, and the insulating layer 72 and the intermediate layer 42 are silicon oxide layers.

Figure 6:
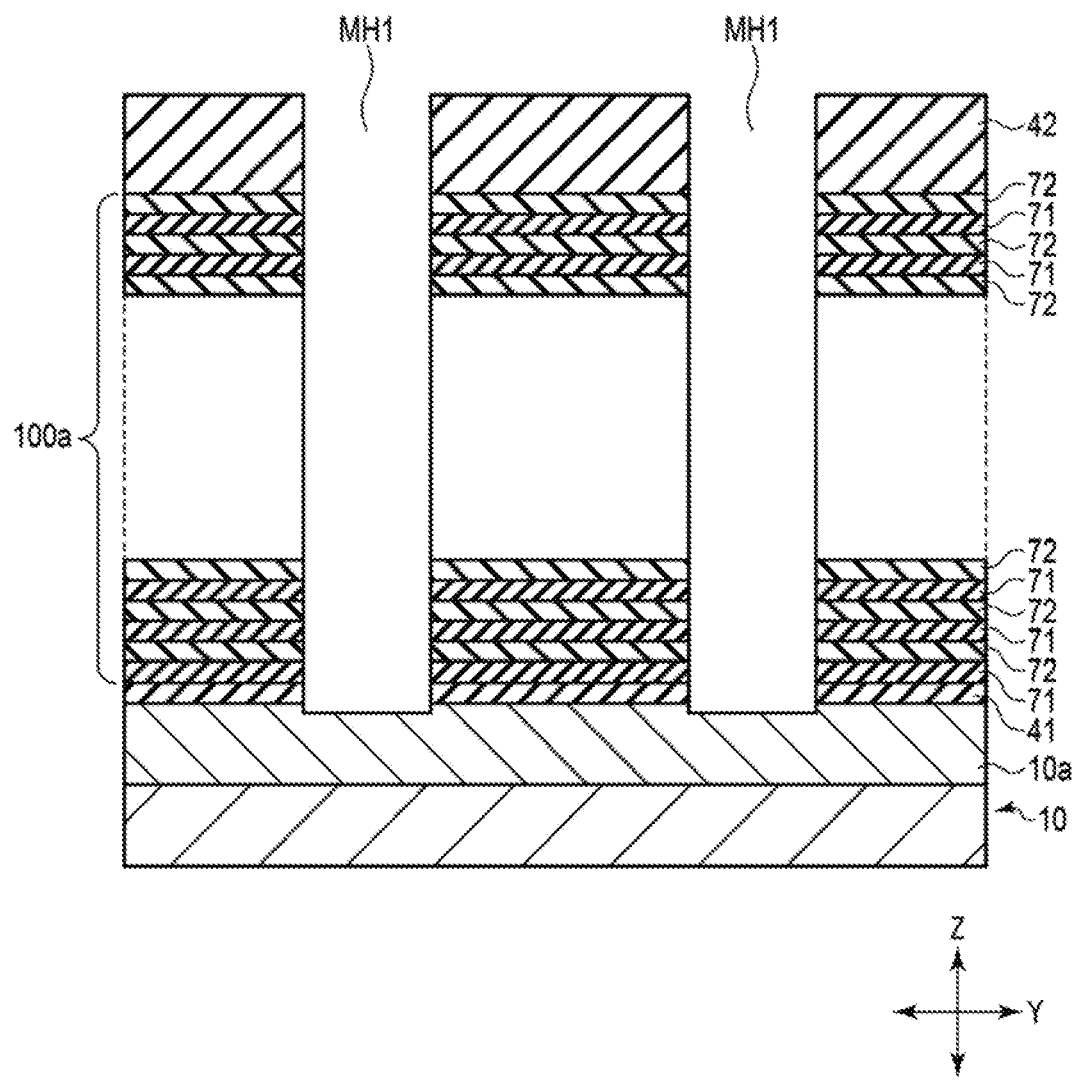
FIG. 6 is a sectional view illustrating a manufacturing process of the memory cell array in the semiconductor device according to the first embodiment, subsequently to FIG. 5.

Next, as illustrated in FIG. 6, a plurality of first memory holes MH1 are formed in the intermediate layer 42 and the first stacked body 100a. The first memory hole MH1 is formed by, for example, reactive ion etching (RIE) using a mask layer (not illustrated). The first memory hole MH1 extends through the intermediate layer 42 and the first stacked body 100a to reach the substrate 10 (the first portion 10a). The first memory hole MH1 is formed to have a diameter D1.

Figure 7:
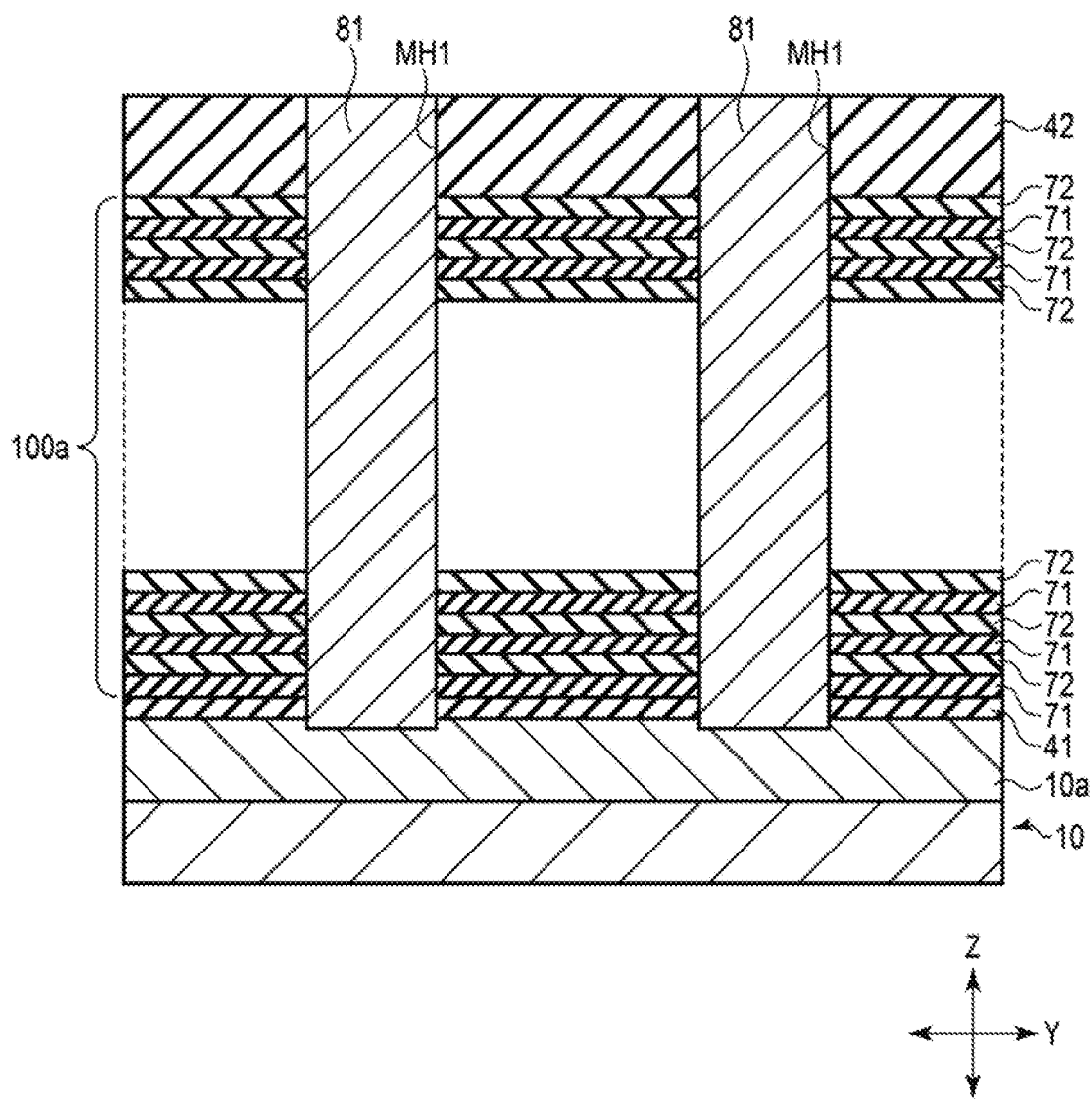
FIG. 7 is a sectional view illustrating a manufacturing process of the memory cell array in the semiconductor device according to the first embodiment, subsequently to FIG. 6.

Next, as illustrated in FIG. 7, a sacrificial layer 81 is formed within the first memory hole MH1. Accordingly, the sacrificial layer 81 fills the first memory hole MH1 and an corresponding opening in the intermediate layer 42. The sacrificial layer 81 is a layer made of a material different from that of the intermediate layer 42 and the first stacked body 100a, and is, for example, an amorphous silicon layer.

Figure 8:
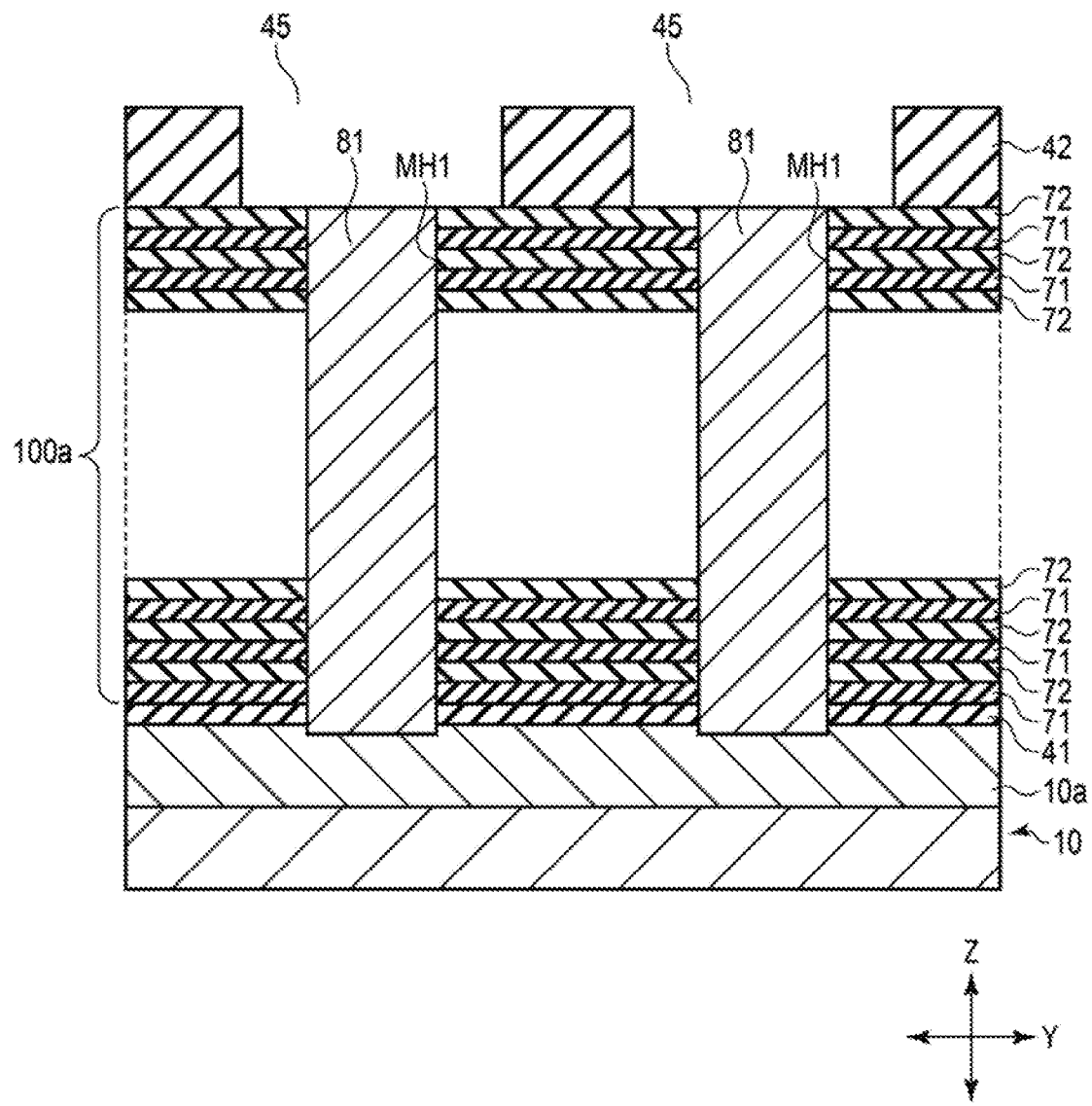
FIG. 8 is a sectional view illustrating a manufacturing process of the memory cell array in the semiconductor device according to the first embodiment, subsequently to FIG. 7.

Next, as illustrated in FIG. 8, the upper surface of the sacrificial layer 81 is recessed to the upper surface of the first stacked body 100a by, for example, wet etching. Then, the diameter of a part (a joining region 45) of the first memory hole MH1 surrounded by the intermediate layer 42 is radially widened by, for example, wet etching of the opening intermediate layer 42. Accordingly, the diameter of the joining region 45 which fills the enlarged opening is larger than the diameter of the first memory hole MH1.

Figure 9:
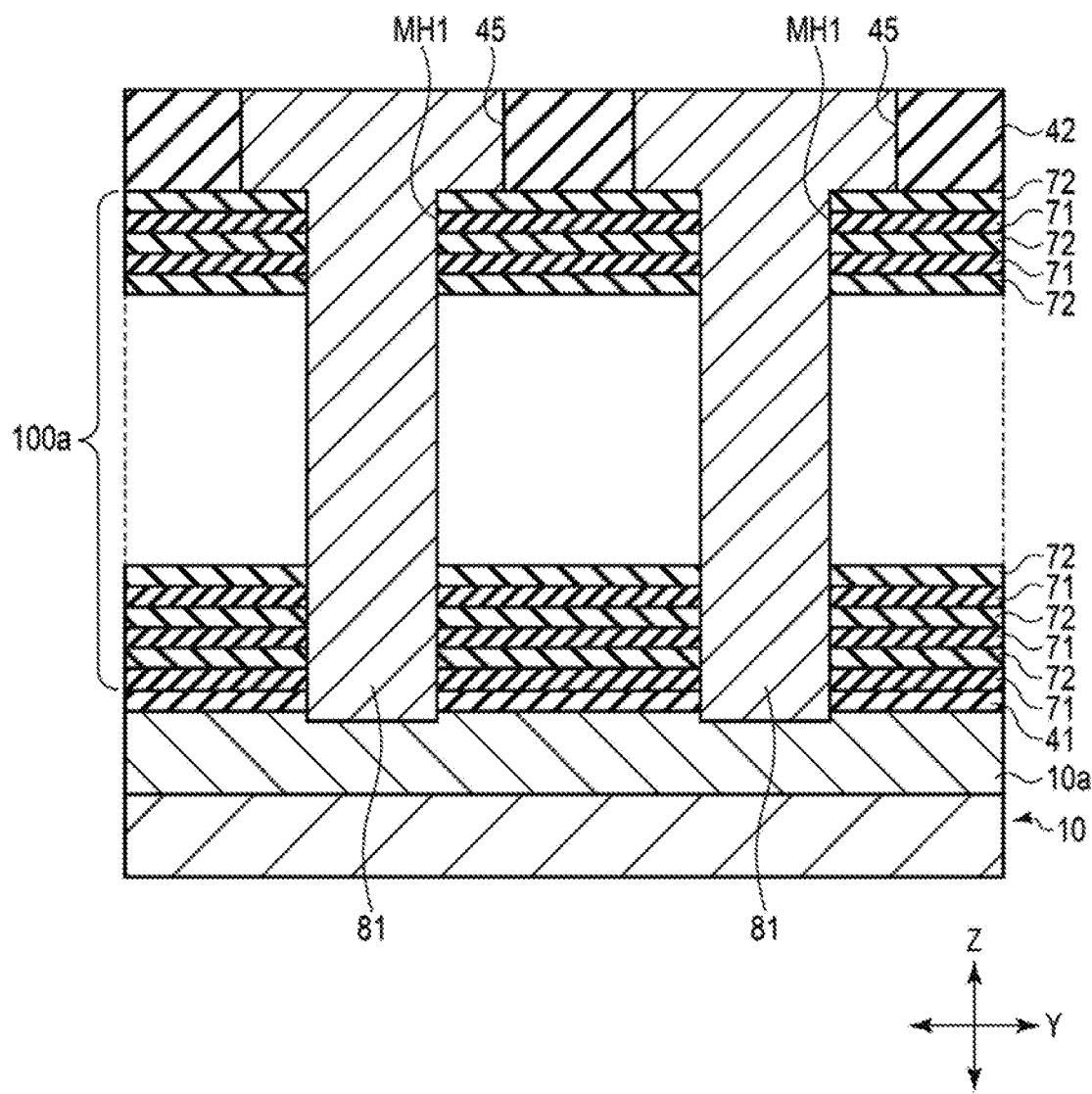
FIG. 9 is a sectional view illustrating a manufacturing process of the memory cell array in the semiconductor device according to the first embodiment, subsequently to FIG. 8.

Next, as illustrated in FIG. 9, the sacrificial layer 81 is filled into the opening of the joining region 45 having an expanded diameter.

Figure 10:
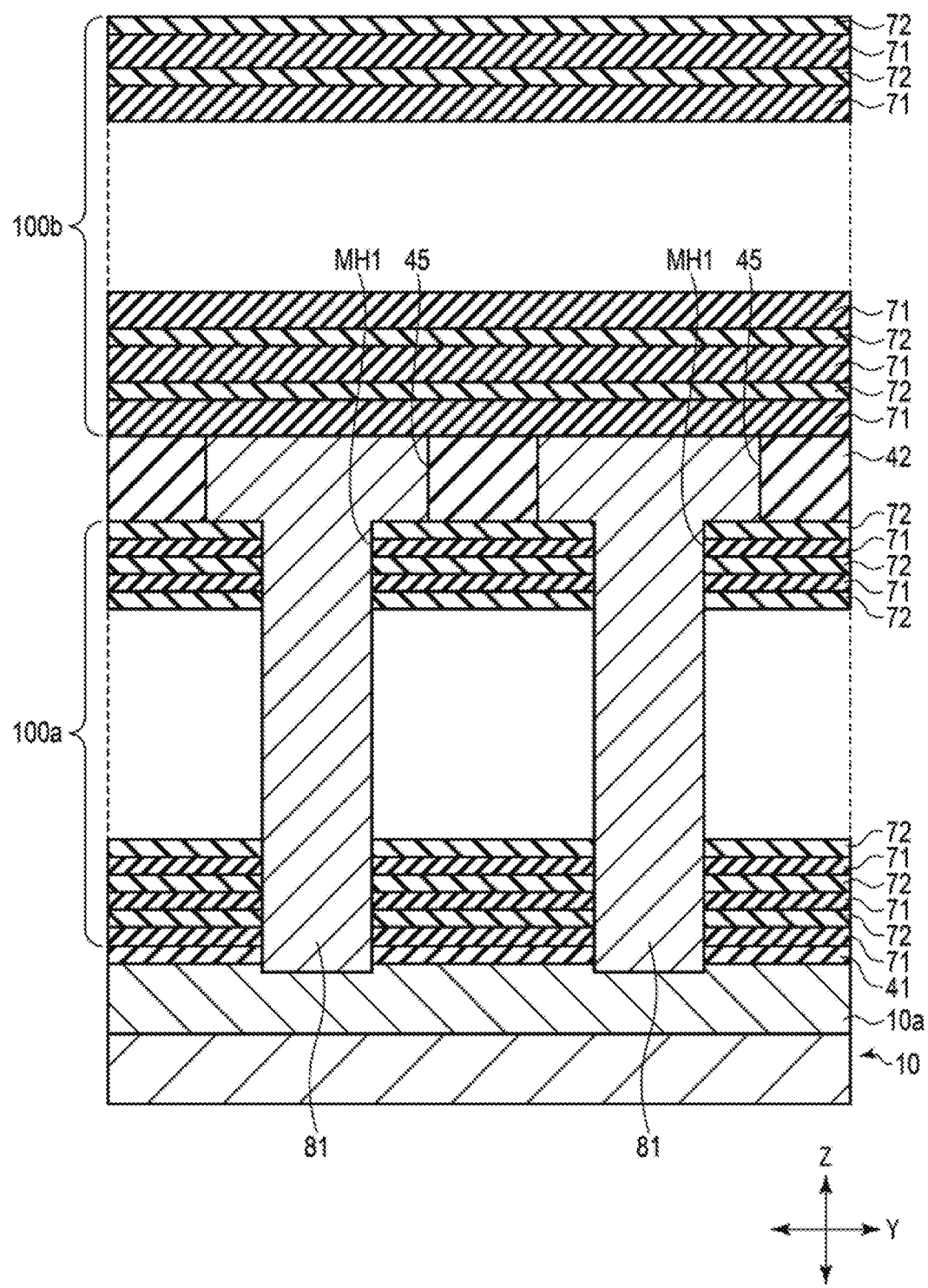
FIG. 10 is a sectional view illustrating a manufacturing process of the memory cell array in the semiconductor device according to the first embodiment, subsequently to FIG. 9.

Next, as illustrated in FIG. 10, the sacrificial layer 71 as a third layer and the insulating layer 72 as a fourth layer are alternately stacked on the intermediate layer 42 and the sacrificial layer 81. A process of alternately stacking the sacrificial layer 71 and the insulating layer 72 is repeated to form the second stacked body 100b including the plurality of sacrificial layers 71 and the plurality of insulating layers 72, on the intermediate layer 42 and the sacrificial layer 81. Here, the sacrificial layer 71 is formed to have a film thickness T2 larger than the film thickness T1 and smaller than the film thickness of the intermediate layer 42.

As in the first stacked body 100a, the sacrificial layer 71 of the second stacked body 100b is a silicon nitride layer, and the insulating layer 72 of the second stacked body 100b is a silicon oxide layer.

Figure 11:
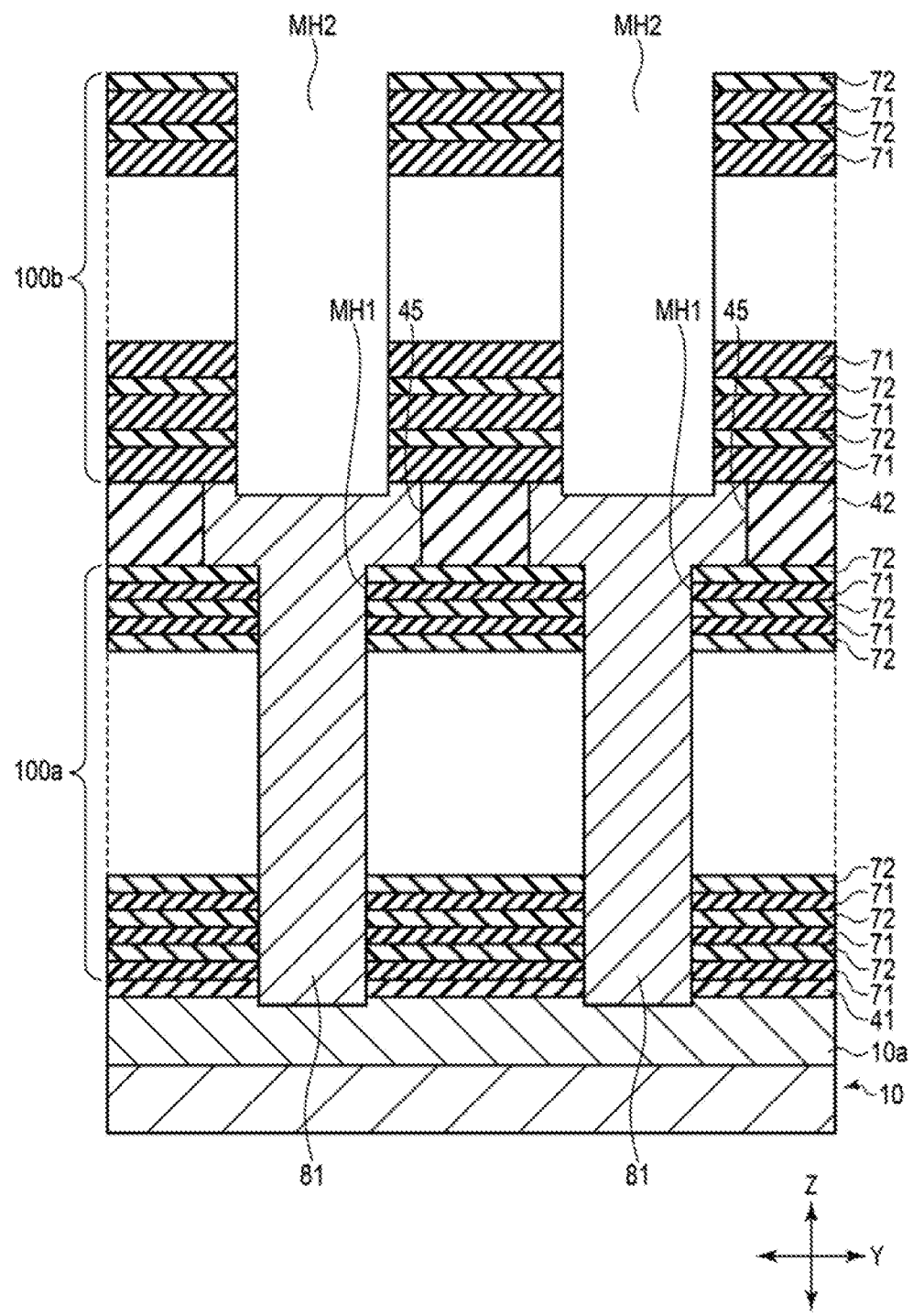
FIG. 11 is a sectional view illustrating a manufacturing process of the memory cell array in the semiconductor device according to the first embodiment, subsequently to FIG. 10.

Next, as illustrated in FIG. 11, a plurality of second memory holes MH2 are formed in the second stacked body 100b. The second memory hole MH2 is formed by an RIE method using a mask layer (not illustrated). The second memory hole MH2 extends through the second stacked body 100b to reach the sacrificial layer 81 buried in the intermediate layer 42. The second memory hole MH2 is formed to have a diameter D2 larger than the diameter D1 and smaller than the diameter of the joint region 45.

Here, the sacrificial layer 81 functions as an etching stop layer for the RIE of the second memory hole MH2. The diameter of the sacrificial layer 81 buried in the intermediate layer 42 is larger than the diameter of the second memory hole MH2. Thus, the bottom of the second memory hole MH2 may be formed without it protruding from the sacrificial layer 81 of the joining region 45. That is, the etching of the second memory hole MH2 may be reliably stopped at or in the sacrificial layer 81 of the joint region 45. This prevents the intermediate layer 42 and the first stacked body 100a under the intermediate layer 42 from being etched during forming of the second memory hole MH2.

Figure 12:
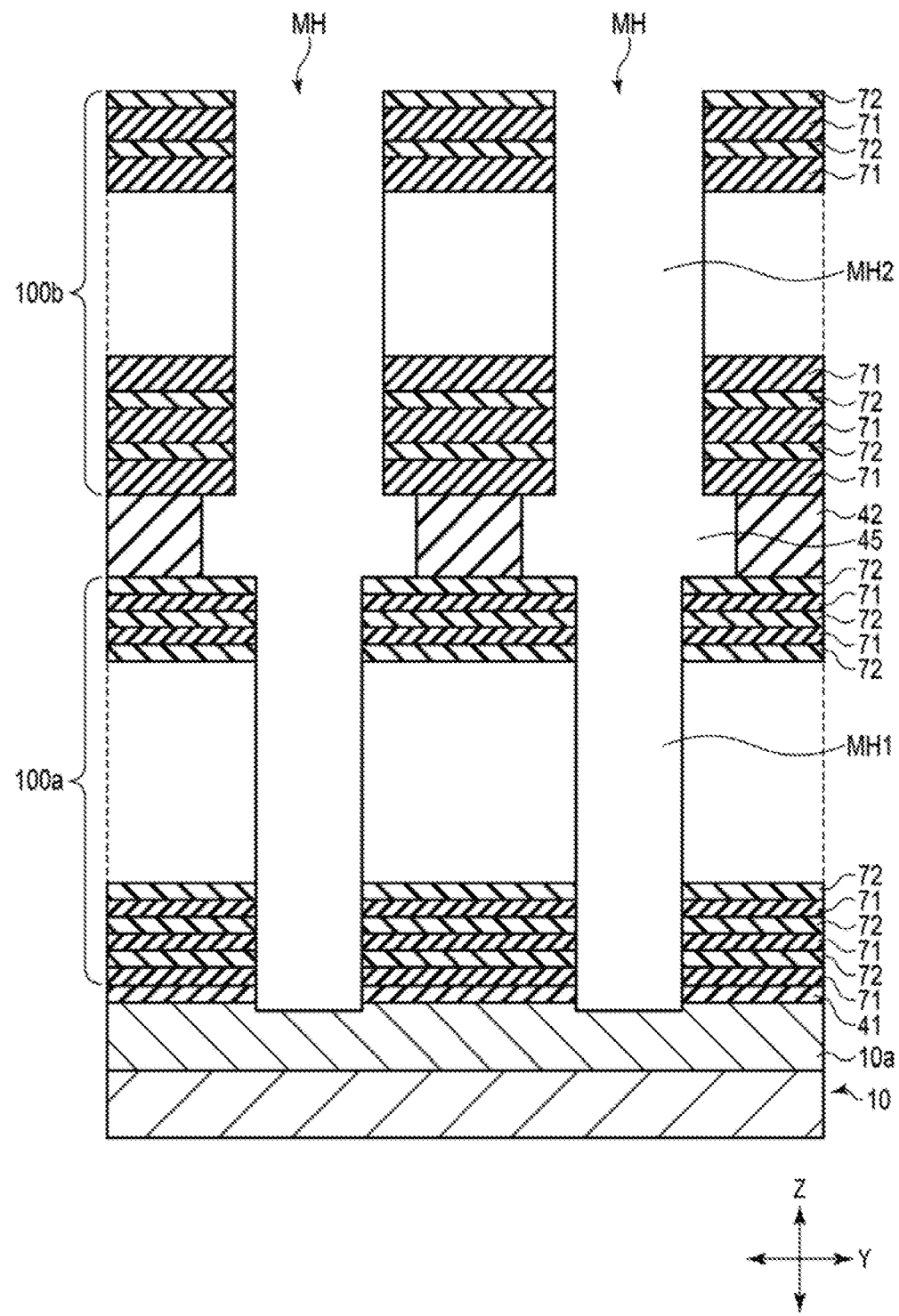
FIG. 12 is a sectional view illustrating a manufacturing process of the memory cell array in the semiconductor device according to the first embodiment, subsequently to FIG. 11.

Next, as illustrated in FIG. 12, the sacrificial layer 81 buried within the intermediate layer 42 and the first memory hole MH1 is removed by, for example, wet etching. Accordingly, the second memory hole MH2, the joining region 45, and the first memory hole MH1 are joined to each other to form a single memory hole MH in the stacked body 100.

Figure 13:
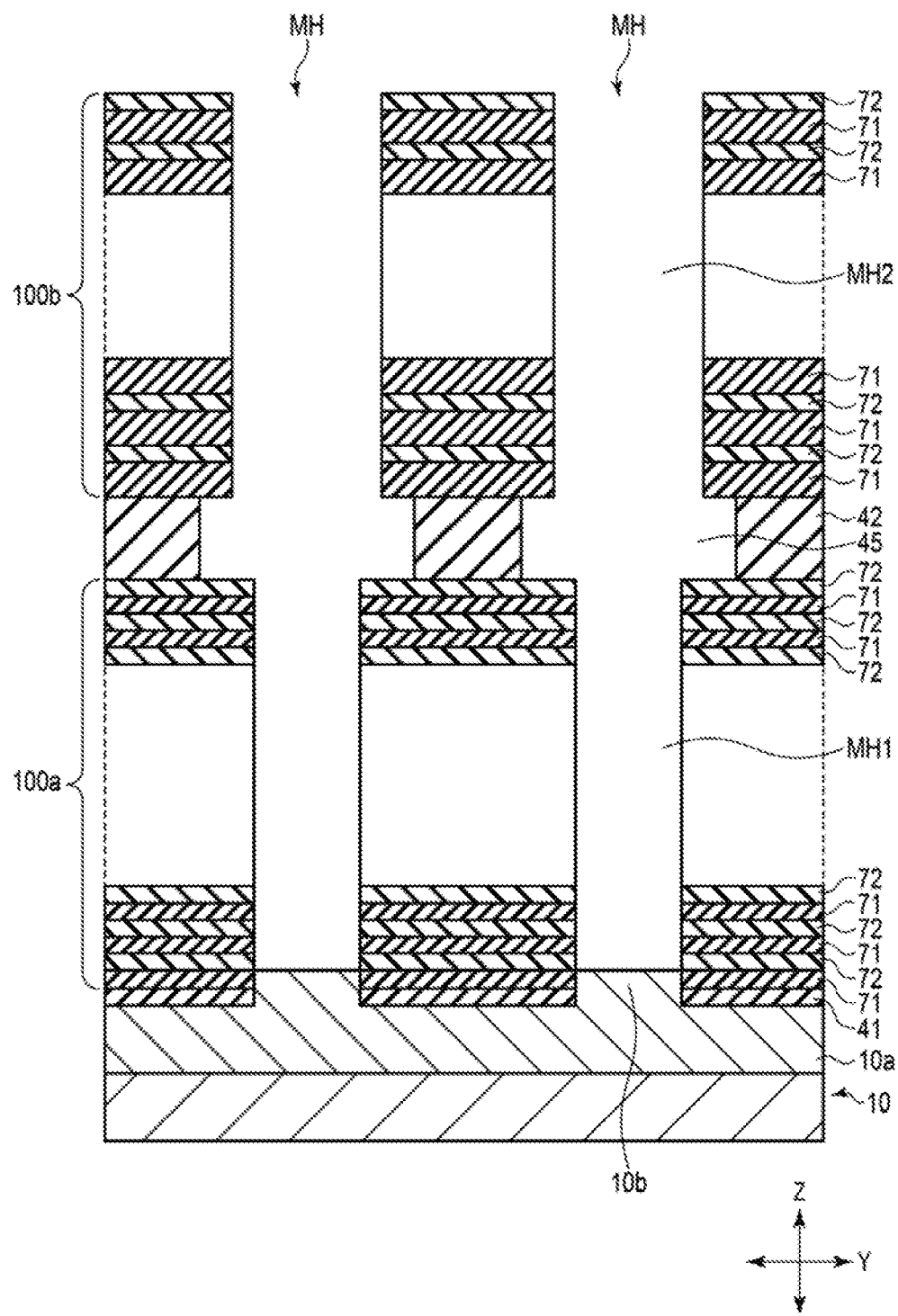
FIG. 13 is a sectional view illustrating a manufacturing process of the memory cell array in the semiconductor device according to the first embodiment, subsequently to FIG. 12.

Next, as illustrated in FIG. 13, silicon is epitaxially grown from an exposed portion of the first portion 10a at the bottom of the memory hole MH. Accordingly, the second portion 10b is formed as a silicon crystal layer at the bottom of the memory hole MH. The second portion 10b is grown such that the height of the upper surface of the second portion 10b becomes substantially the same as the upper surface of the lowermost sacrificial layer 71 in the first stacked body 100a.

Figure 14:
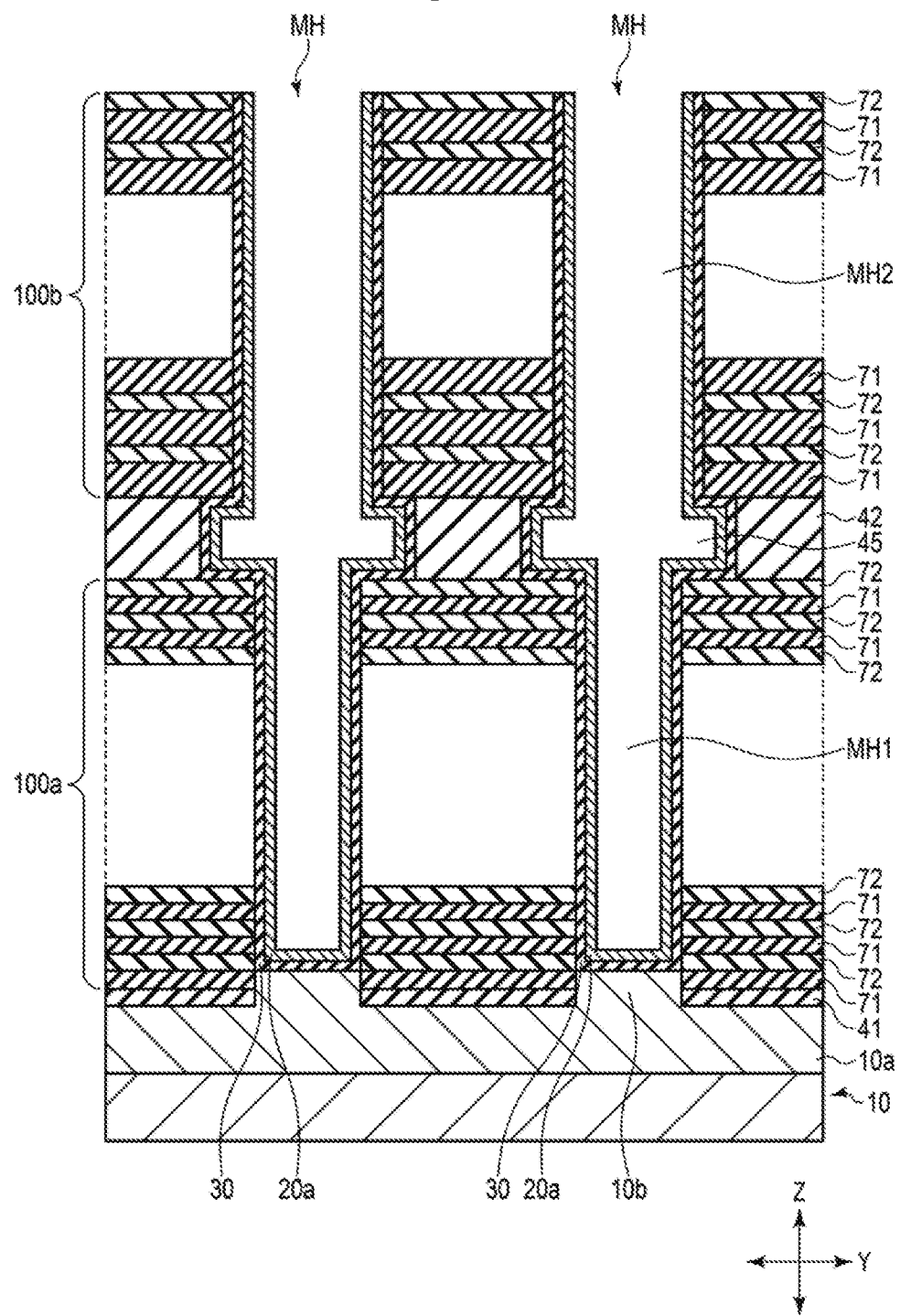
FIG. 14 is a sectional view illustrating a manufacturing process of the memory cell array in the semiconductor device according to the first embodiment, subsequently to FIG. 13.

Next, as illustrated in FIG. 14, the memory layer 30 is formed within the memory hole MH. The memory layer 30 is conformally formed along the side surface and the bottom of the memory hole MH. Here, the block insulating layer 33, the charge storage layer 32, and the tunnel insulating layer 31 illustrated in FIGS. 3 and 4 are sequentially formed within the memory hole MH.

Then, the cover layer 20a is formed inside the memory layer 30. The cover layer 20a is conformally formed along the side surface and the bottom of the memory hole MH.

Figure 15:
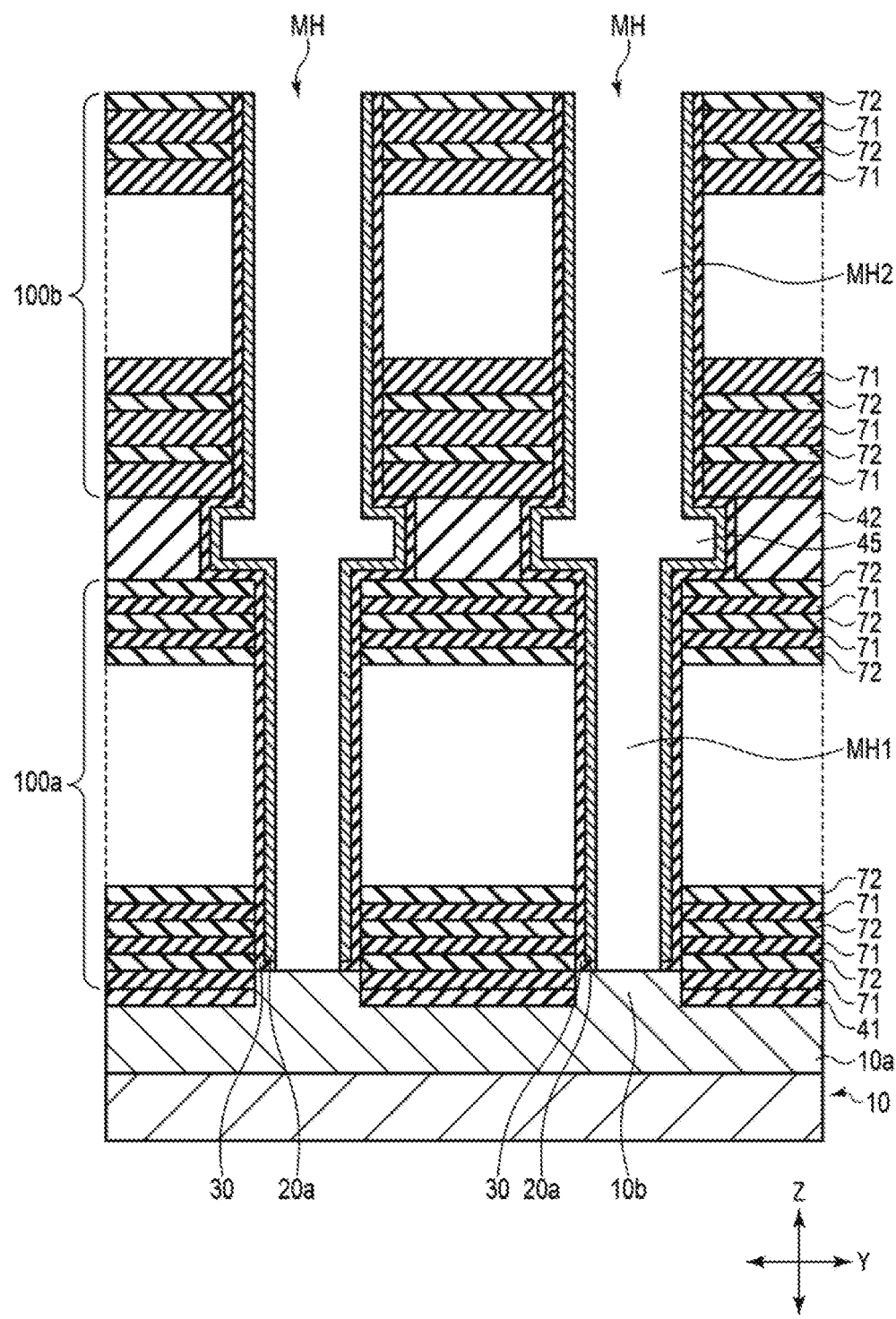
FIG. 15 is a sectional view illustrating a manufacturing process of the memory cell array in the semiconductor device according to the first embodiment, subsequently to FIG. 14.

Next, as illustrated in FIG. 15, the cover layer 20a and the memory layer 30 deposited at the bottom of the memory hole MH are removed by a RIE method using a mask layer (not illustrated). Here, the memory layer 30 formed on the side surface of the memory hole MH is covered with the cover layer 20a and protected, and thus is not damaged by the RIE.

Figure 16:
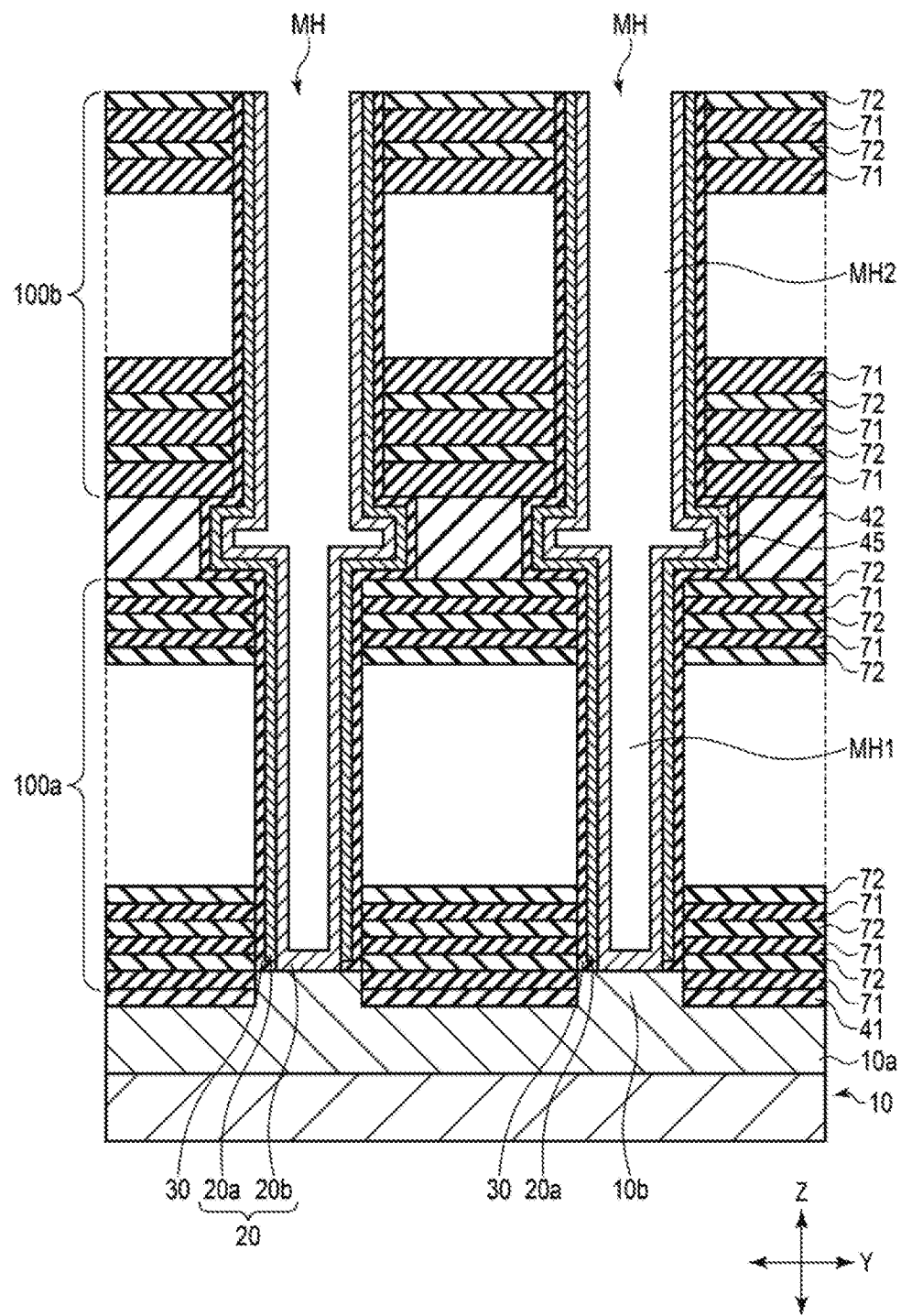
FIG. 16 is a sectional view illustrating a manufacturing process of the memory cell array in the semiconductor device according to the first embodiment, subsequently to FIG. 15.

Next, as illustrated in FIG. 16, the body layer 20b is formed inside the memory hole MH. The body layer 20b is formed on the side surface of the cover layer 20a, and on the substrate 10 exposed at the bottom of the memory hole MH. The lower end portion of the body layer 20b is in contact with the substrate 10.

The cover layer 20a and the body layer 20b are formed as, for example, amorphous silicon layers, and then crystallized into polycrystalline silicon layers by heat treatment to constitute the semiconductor layer 20.

Figure 17:
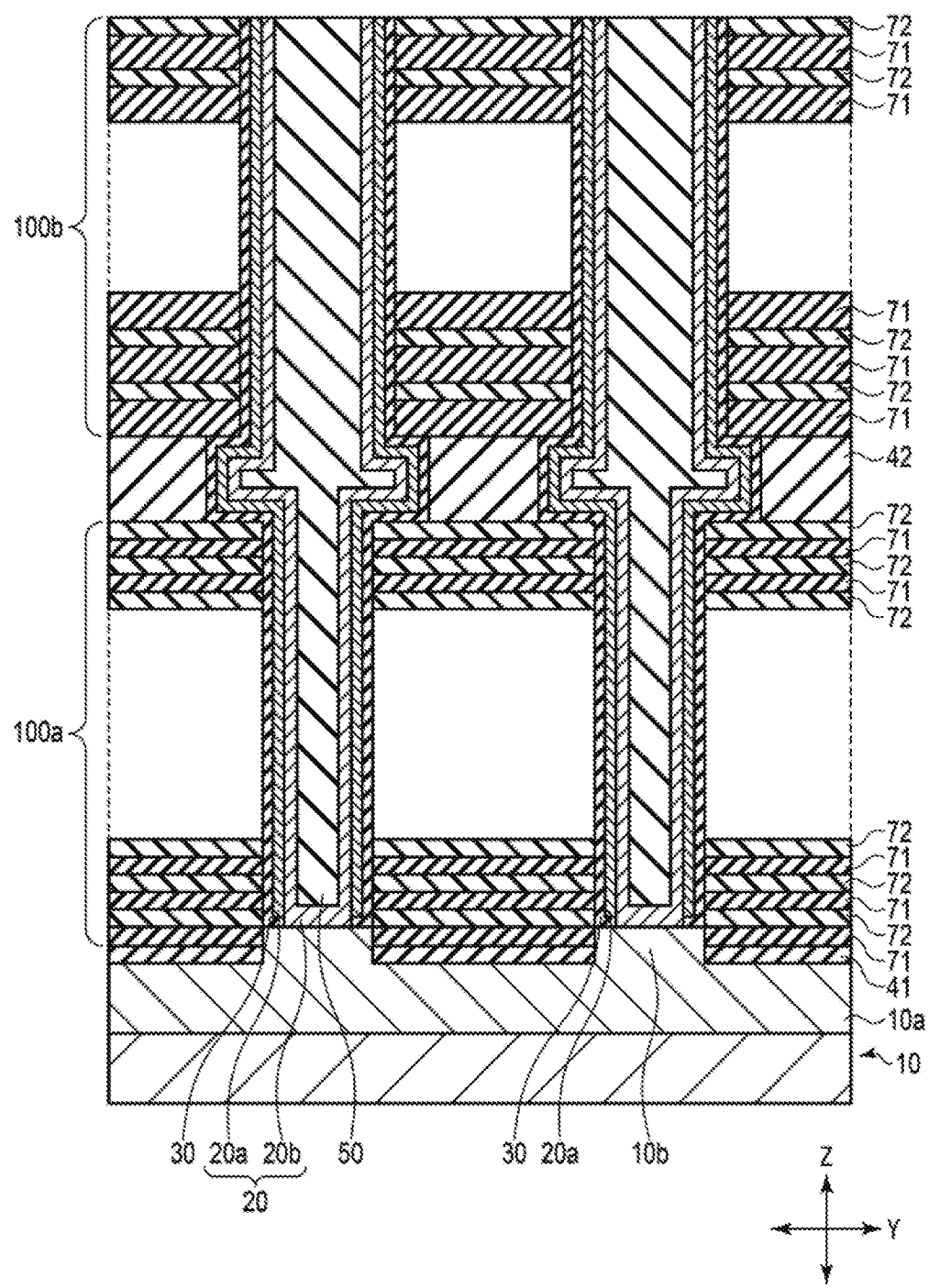
FIG. 17 is a sectional view illustrating a manufacturing process of the memory cell array in the semiconductor device according to the first embodiment, subsequently to FIG. 16.

Next, as illustrated in FIG. 17, the core layer 50 is formed inside the body layer 20b. In this manner, the plurality of columnar portions CL each of which includes the memory layer 30, the semiconductor layer 20, and the core layer 50 are formed within the stacked body 100. Therefore, the first columnar portion CL1 having the diameter D1, and the second columnar portion CL2 having the diameter D2 larger than the diameter D1 are formed.

Next, although not illustrated, a plurality of slits are formed in the stacked body 100 by a RIE method using a mask layer. The slit extends through the stacked body 100 to reach the substrate 10.

Figure 18:
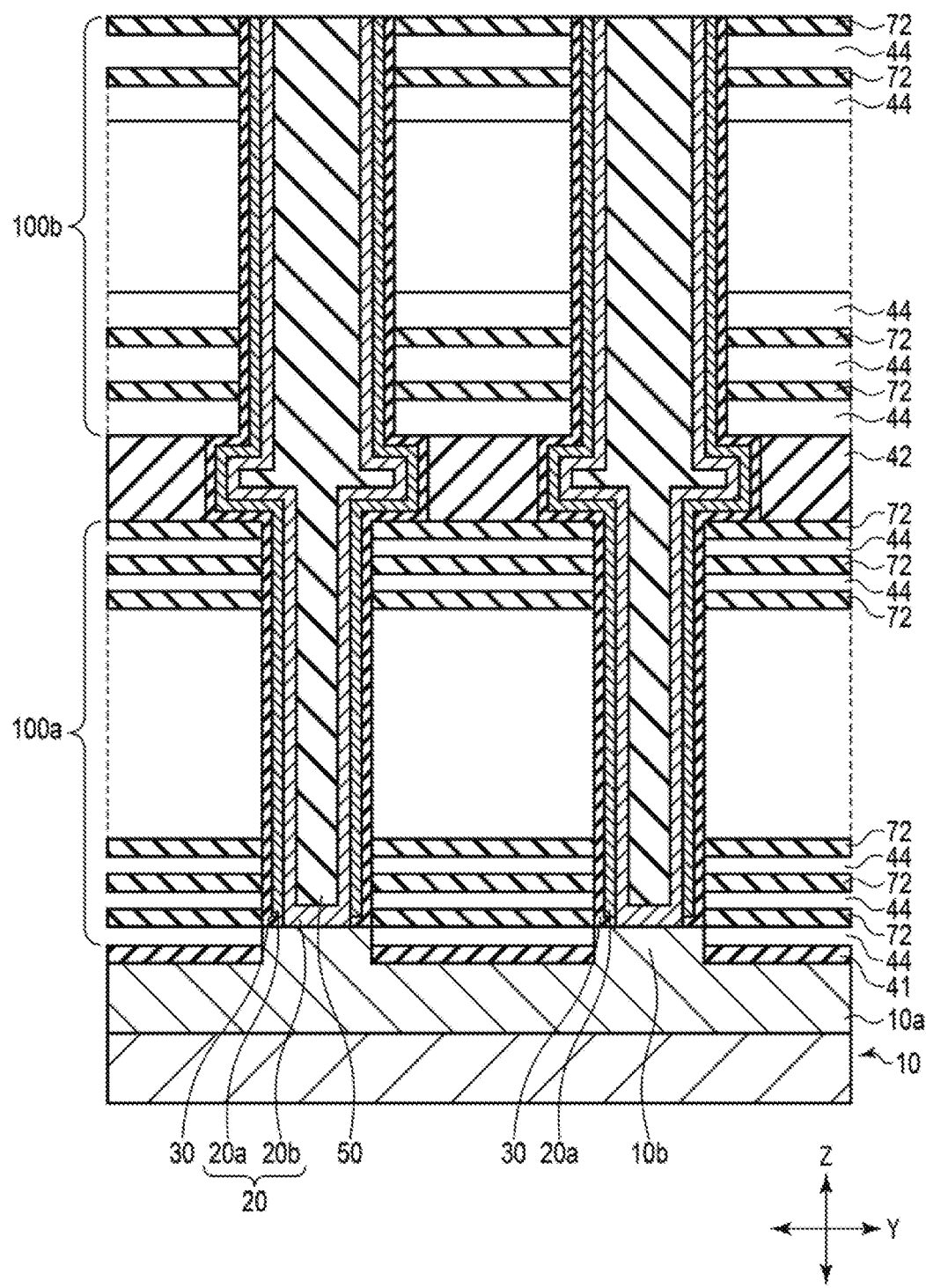
FIG. 18 is a sectional view illustrating a manufacturing process of the memory cell array in the semiconductor device according to the first embodiment, subsequently to FIG. 17.

Then, as illustrated in FIG. 18, the sacrificial layers 71 are removed by an etchant or an etching gas supplied through the slits. For example, as the etchant, a phosphoric acid-containing etchant is used. Accordingly, voids 44 are formed between the insulating layers 72 which are vertically adjacent to each other. The void 44 is also formed between the insulating layer 41 and the lowermost insulating layer 72 in the first stacked body 100a, and between the lowermost insulating layer 72 and the intermediate layer 42 in the second stacked body 100b.

Here, the void 44 in the first stacked body 100a has a dimension T1 along the Z direction. Meanwhile, the void 44 in the second stacked body 100b has a dimension T2 along the Z direction which is larger than the dimension T1.

The plurality of insulating layers 72 of the stacked body 100 are in contact with the side surfaces of the plurality of columnar portions CL to surround the side surfaces of the columnar portions CL. The plurality of insulating layers 72 are supported by such physical coupling with the plurality of columnar portions CL, and the voids 44 between the insulating layers 72 are maintained.

Next, the side surface of the second portion 10b, which is exposed at the lowermost layer void 44 of the first stacked body 100a, is oxidized by, for example, a thermal oxidation method by exposure to oxygen while at an elevated temperature. Accordingly, an insulating layer integrated with the insulating layer 41 is formed on the side surface of the second portion 10b.

Then, the conductive layers 70 are formed in the voids 44 by, for example, a chemical vapor deposition (CVD) method. Here, a source gas is supplied to the voids 44 through the slits. In this manner, the conductive layers 70 having a film thickness T1 are formed in the first stacked body 100a, and the conductive layers 70 having a film thickness T2 larger than the film thickness T1 are formed in the second stacked body 100b.

Thereafter, although not illustrated, an insulating layer is formed on the side surface and the bottom of the slit. After the insulating layer formed on the bottom of the slit is removed by a RIE method, the wiring portion L1 is embedded inside an insulating layer 63 within the slit. The lower end portion of the wiring portion L1 is in contact with the substrate 10.

Effect of First Embodiment

In a NAND-type flash memory in which memory cells are three-dimensionally arranged, columnar portions constituting the memory cells are formed within a stacked body. Then, when the number of stacks of the stacked body is large, the columnar portion is formed in two separate stages, that is, a first columnar portion at the lower side and a second columnar portion at the upper side. Here, for the convenience of a process, there may be a case where the first columnar portion at the lower side and the second columnar portion at the upper side are formed such that their diameters are different from each other. In this case, the available channel volume of the memory cell in the first columnar portion is different from the available channel volume of the memory cell in the second columnar portion, and thus, a memory cell characteristic (e.g., a coupling ratio) is varied.

In contrast, according to the above described first embodiment, the film thickness of the conductive layer 70 functioning as a word line is adjusted according to the diameter D1 of the first columnar portion CL1 at the lower side and the diameter D2 of the second columnar portion CL2 at the upper side. More specifically, in the first embodiment, when the diameter D1 of the first columnar portion CL1 at the lower side is smaller than the diameter D2 of the second columnar portion CL2 at the upper side, the film thickness T1 of the conductive layer 70 in the first stacked body 100a (corresponding to the first columnar portion CL1) is made smaller than the film thickness T2 of the conductive layer 70 in the second stacked body 100b (corresponding to the second columnar portion CL2). Thus, the channel length formed by the length of the semiconductor layer 20 facing the conductive layer 70 of the memory cell MC in the first columnar portion CL1 having the small available channel volume is decreased, and the channel length of the memory cell MC in the second columnar portion CL2 having the large available channel volume is increased. Accordingly, it is possible to adjust and reduce a fluctuation of a memory cell characteristic which is caused by different diameters in the first columnar portion CL1 and the second columnar portion CL2.

In the first embodiment, the columnar portion CL has a two-stage configuration of the first columnar portion CL1 and the second columnar portion CL2, but may have a configuration of three or more stages. In this case as well, the film thickness of the conductive layer 70 is adjusted according to the diameter of each columnar portion.

Although a silicon nitride layer is exemplified as the first layer (sacrificial layer) 71, a metal layer or a silicon layer doped with impurities may be used as the first layer 71. In this case, the first layer 71 as formed becomes the conductive layer 70, and thus, a process of replacing the first layer 71 by an electrode layer is unnecessary.

Instead of the first layers 71, the second layers (insulating layers) 72 may be removed by etching through slits so that voids may be formed between the conductive layers 70 which are vertically adjacent to each other.

Modification of First Embodiment

Figure 19:
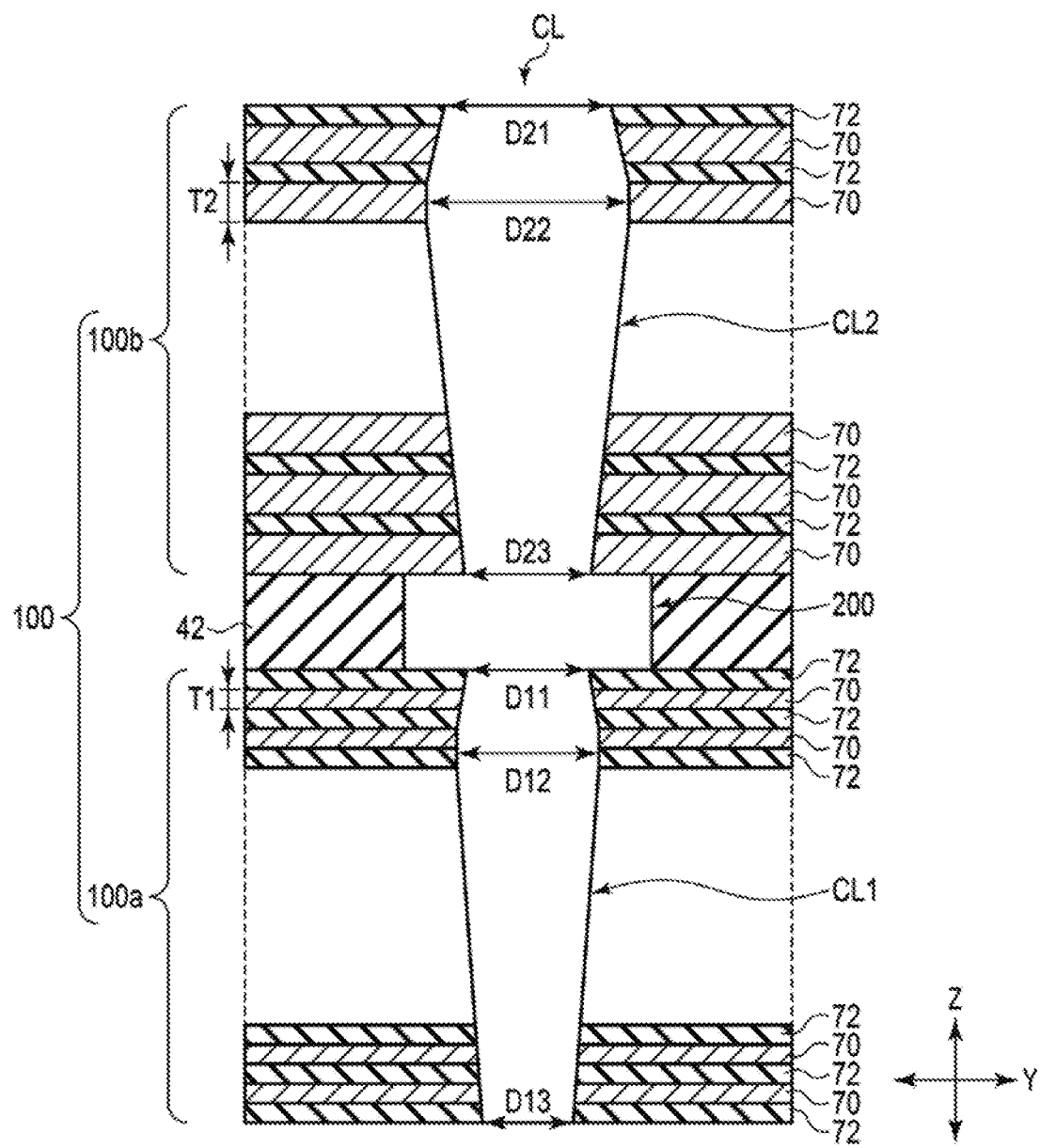
FIG. 19 is a sectional view illustrating a modification of the memory cell array in the semiconductor device according to the first embodiment.

FIG. 19 is a sectional view illustrating a modification of the memory cell array 1 in the semiconductor device according to the first embodiment.

As illustrated in FIG. 19, in the modification, the sidewalls of each of the first columnar portion CL1 and the second columnar portion CL2 have a bow shape. The bow shape indicates the following shape.

The diameter of the first columnar portion CL1 increases from the uppermost layer (upper end, top portion) toward a certain layer (bow portion) between the uppermost layer and the lowermost layer (lower end, bottom portion). The bow portion has the largest diameter in the first columnar portion CL1. Then, the diameter of the first columnar portion CL1 decreases from the bow portion toward the bottom portion. That is, a diameter D11 of the top portion of the first columnar portion CL1, a diameter D12 of the bow portion of the first columnar portion CL1, and a diameter D13 of the bottom portion of the first columnar portion CL1 have a relationship of D11, D13<D12. In FIG. 19, the first columnar portion CL1 has a relationship of D11>D13, but this relationship is not limited.

The diameter of the second columnar portion CL2 has the same configuration as the diameter of the first columnar portion CL1. That is, a diameter D21 of the top portion of the second columnar portion CL2, a diameter D22 of the bow portion of the second columnar portion CL2, and a diameter D23 of the bottom portion of the second columnar portion CL2 have a relationship of D21, D23<D22.

Then, a diameter of an arbitrary portion of the first columnar portion CL1 is smaller than a diameter of a corresponding portion of the second columnar portion CL2. That is, the diameter D11 of the top portion of the first columnar portion CL1 is smaller than the diameter D21 of the top portion of the second columnar portion CL2, the diameter D12 of the bow portion of the first columnar portion CL1 is smaller than the diameter D22 of the bow portion of the second columnar portion CL2, and the diameter D13 of the bottom portion of the first columnar portion CL1 is smaller than the diameter D23 of the bottom portion of the second columnar portion CL2.

Therefore, in the modification, when the diameter of an arbitrary portion of the first columnar portion CL1 is smaller than the diameter of a corresponding portion of the second columnar portion CL2, the conductive layer 70 in the first stacked body 100a (corresponding to the first columnar portion CL1) is formed to have a film thickness T1 smaller than a film thickness T2 of the conductive layer 70 in the second stacked body 100b (corresponding to the second columnar portion CL2).

According to a change of the diameter in each of the first columnar portion CL1 and the second columnar portion CL2 having bow shapes, the corresponding conductive layer 70 may be formed with a gradually changing film thickness. That is, in each of the first columnar portion CL1 and the second columnar portion CL2, the film thickness of the corresponding conductive layer 70 gradually increases from the top portion toward the bow portion. The film thickness of the corresponding conductive layer 70 gradually decreases from the bow portion toward the bottom portion.

Second Embodiment

Hereinafter, a semiconductor device according to the second embodiment will be described with reference to FIGS. 20 to 23. In the second embodiment, a magnitude relationship between the diameter of the first columnar portion CL1 and the diameter of the second columnar portion CL2 is opposite to that of the above described first embodiment.

In the second embodiment, descriptions on the same points as those in the first embodiment will be omitted, and different points will be mainly described.

Structure of Second Embodiment

Figure 20:
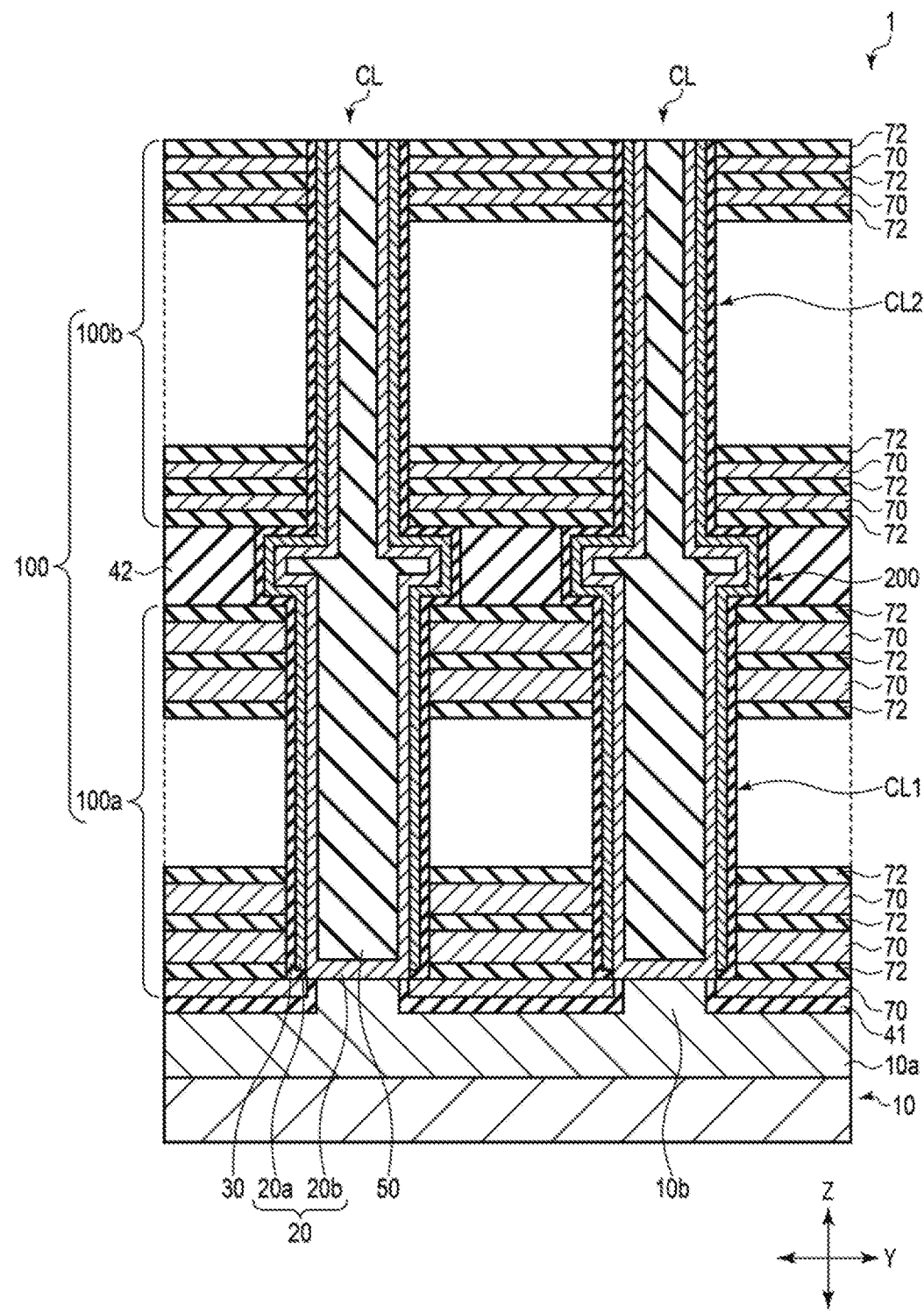
FIG. 20 is a sectional view illustrating a memory cell array in a semiconductor device according to a second embodiment.

FIG. 20 is a sectional view illustrating the memory cell array 1 in the semiconductor device according to the second embodiment.

As illustrated in FIG. 20, the second embodiment is different from the first embodiment in a magnitude relationship between the diameter of the first columnar portion CL1 and the diameter of the second columnar portion CL2, and thereby a magnitude relationship between the film thickness of the conductive layer 70 of the first stacked body 100a and the film thickness of the conductive layer 70 of the second stacked body 100b.

More specifically, the diameter of the first columnar portion CL1 is larger than the diameter of the second columnar portion CL2. The film thickness of the conductive layers 70 in the first stacked body 100a is larger than the film thickness of the conductive layers 70 in the second stacked body 100b. Details of these diameters and film thicknesses will be described below with reference to FIGS. 21 and 22.

In FIG. 20, the film thickness of the lowermost conductive layer 70 in the first stacked body 100a is smaller than the film thickness of the conductive layers 70 other than the lowermost layer in the first stacked body 100a, but is not limited thereto. The film thicknesses may be substantially the same.

The diameter of the core layer 50 in the first columnar portion CL1 is larger than the diameter of the core layer 50 in the second columnar portion CL2. The diameter of the core layer 50 in the joint portion 200 is larger than the diameter of the core layer 50 in the first columnar portion CL1 and the second columnar portion CL2.

The diameter (inner diameter and outer diameter) of the semiconductor layer 20 in the first columnar portion CL1 is larger than the inner diameter and the outer diameter of the semiconductor layer 20 in the second columnar portion CL2.

The inner diameter and the outer diameter of the semiconductor layer 20 in the joining portion 200 are larger than the inner diameter and the outer diameter of the semiconductor layer 20 in the first columnar portion CL1 and the second columnar portion CL2.

The diameter (inner diameter and outer diameter) of the memory layer 30 in the first columnar portion CL1 is larger than the inner diameter and the outer diameter of the memory layer 30 in the second columnar portion CL2. The inner diameter and the outer diameter of the memory layer 30 in the joining portion 200 are larger than the inner diameter and the outer diameter of the memory layer 30 in the first columnar portion CL1 and the second columnar portion CL2.

Figure 21:
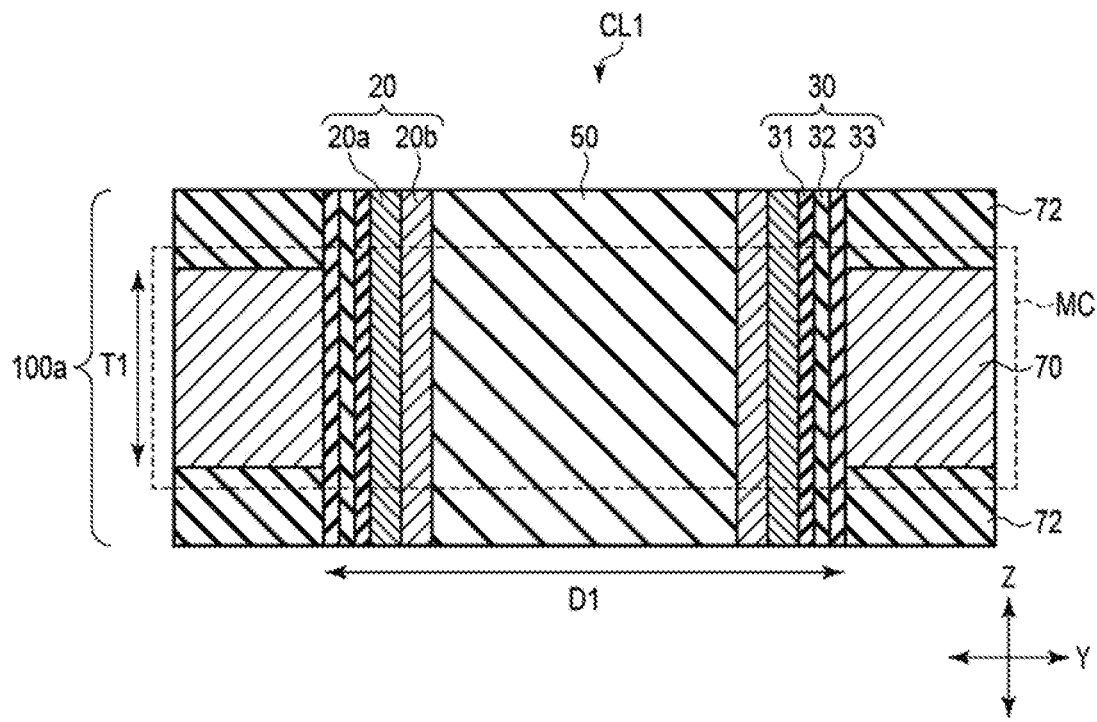
FIG. 21 is a sectional view illustrating a part of a first stacked body and a first columnar portion in the semiconductor device according to the second embodiment, in an enlarged scale.
Figure 22:
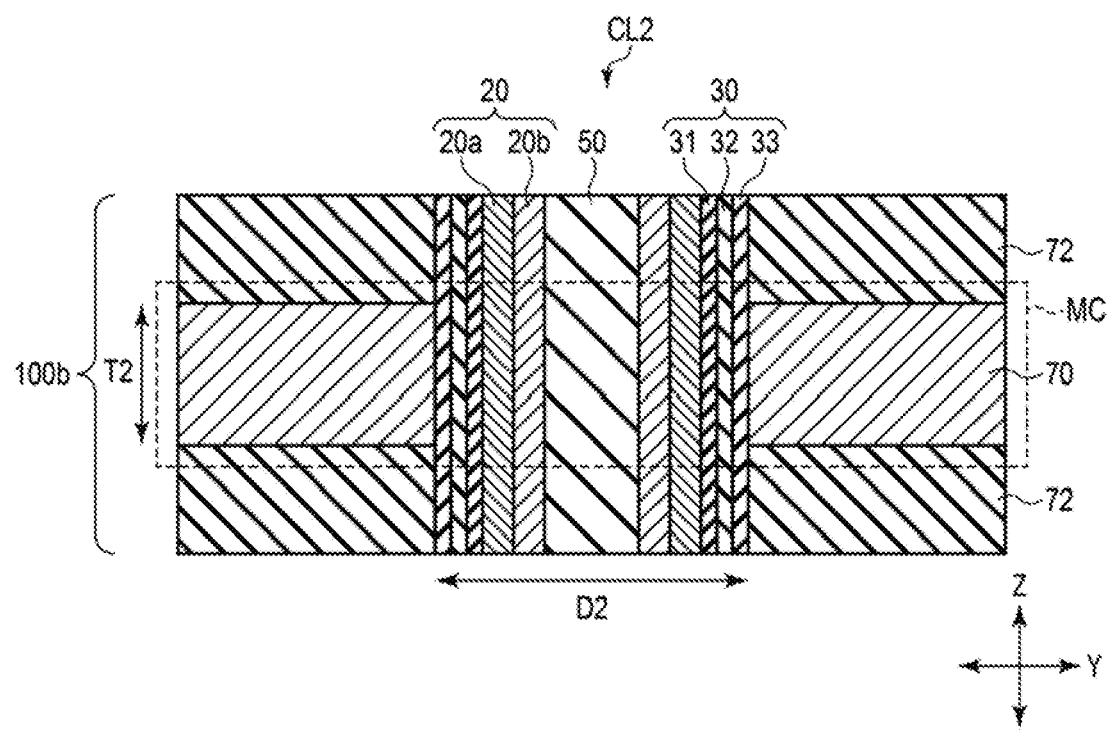
FIG. 22 is a sectional view illustrating a part of a second stacked body and a second columnar portion in the semiconductor device according to the second embodiment, in an enlarged scale.

FIG. 21 is a sectional view illustrating a part of the first stacked body 100a and the first columnar portion CL1 in the semiconductor device according to the second embodiment, in an enlarged scale. FIG. 22 is a sectional view illustrating a part of the second stacked body 100b and the second columnar portion CL2 in the semiconductor device according to the second embodiment, in an enlarged scale.

As illustrated in FIGS. 21 and 22, the first columnar portion CL1 has a diameter D1. Meanwhile, the second columnar portion CL2 has a diameter D2 smaller than the diameter D1. That is, the available channel volume of a memory cell MC in the first columnar portion CL1 is larger than the available channel volume of a memory cell MC in the second columnar portion CL2.

The conductive layer 70 in the first stacked body 100a has a film thickness T1. Meanwhile, the conductive layer 70 in the second stacked body 100b has a film thickness T2 smaller than the film thickness T1. That is, the channel length of a memory cell MC in the first columnar portion CL1 is larger than the channel length of a memory cell MC in the second columnar portion CL2.

Effect of Second Embodiment

According to the above described second embodiment, when the diameter D1 of the first columnar portion CL1 at the lower side is larger than the diameter D2 of the second columnar portion CL2 at the upper side, the film thickness T1 of the conductive layer 70 in the first stacked body 100a (corresponding to the first columnar portion CL1) is made larger than the film thickness T2 of the conductive layer 70 in the second stacked body 100b (corresponding to the second columnar portion CL2). That is, the channel length of the memory cell MC in the first columnar portion CL1 having the large available channel volume is increased, and the channel length of the memory cell MC in the second columnar portion CL2 having the small available channel volume is decreased. Accordingly, it is possible to adjust and reduce a fluctuation of a memory cell characteristic which is caused by different diameters in the first columnar portion CL1 and the second columnar portion CL2.

Modification of Second Embodiment

Figure 23:
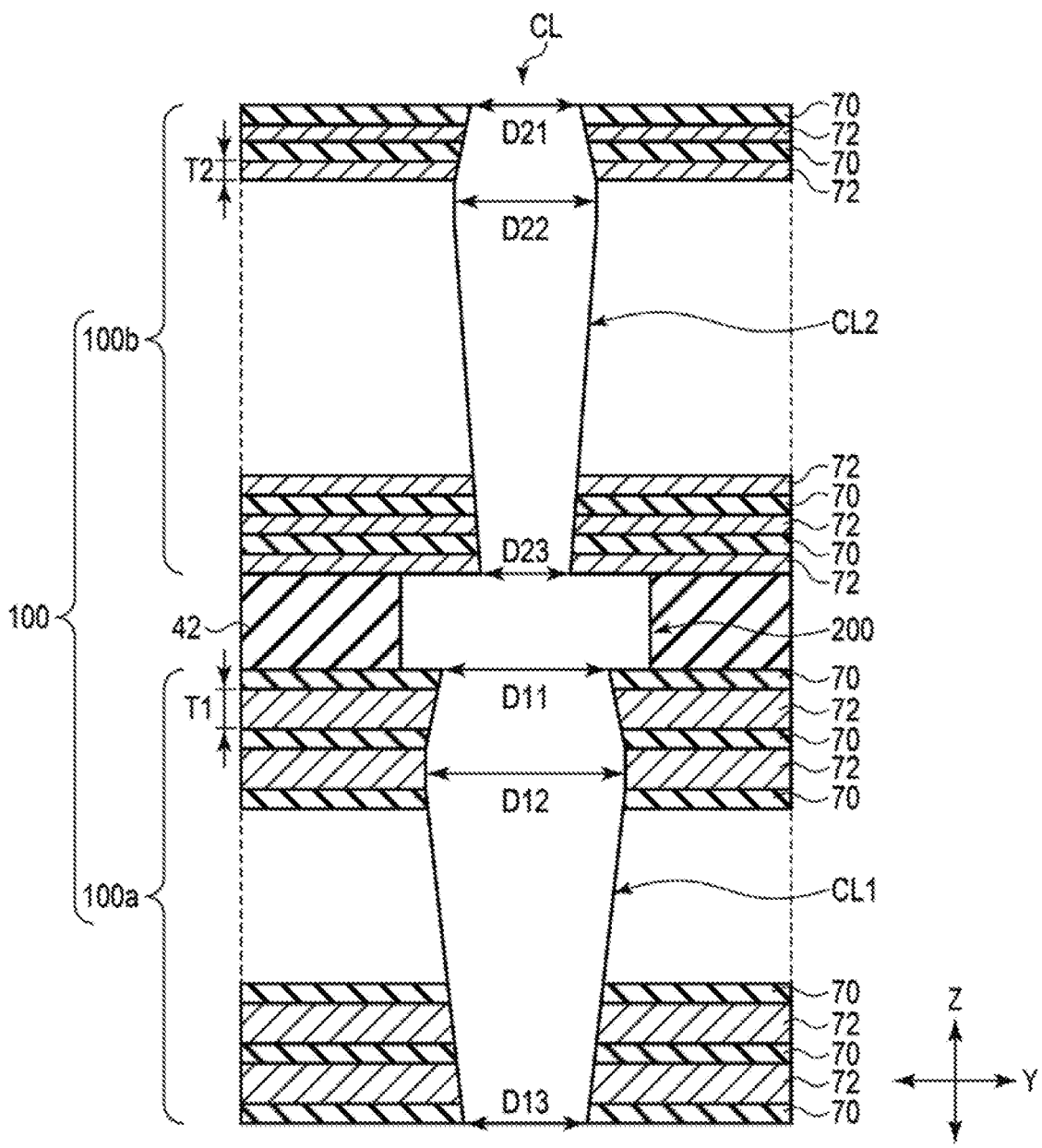
FIG. 23 is a sectional view illustrating a modification of the memory cell array in the semiconductor device according to the second embodiment.

FIG. 23 is a sectional view illustrating a modification of the memory cell array 1 in the semiconductor device according to the second embodiment.

As illustrated in FIG. 23, in the modification, each of the first columnar portion CL1 and the second columnar portion CL2 has a bow shape.

In this case, a diameter of an arbitrary portion of the first columnar portion CL1 is larger than a diameter of a corresponding portion of the second columnar portion CL2. That is, a diameter D11 of the top portion of the first columnar portion CL1 is larger than a diameter D21 of the top portion of the second columnar portion CL2, a diameter D12 of the bow portion of the first columnar portion CL1 is larger than a diameter D22 of the bow portion of the second columnar portion CL2, and a diameter D13 of the bottom portion of the first columnar portion CL1 is larger than a diameter D23 of the bottom portion of the second columnar portion CL2.

That is, in the modification, when the diameter of an arbitrary portion of the first columnar portion CL1 is larger than the diameter of a corresponding portion of the second columnar portion CL2, the conductive layer 70 in the first stacked body 100a (corresponding to the first columnar portion CL1) is formed to have a film thickness T1 larger than a film thickness T2 of the conductive layer 70 in the second stacked body 100b (corresponding to the second columnar portion CL2).

Application Example

Figure 24:
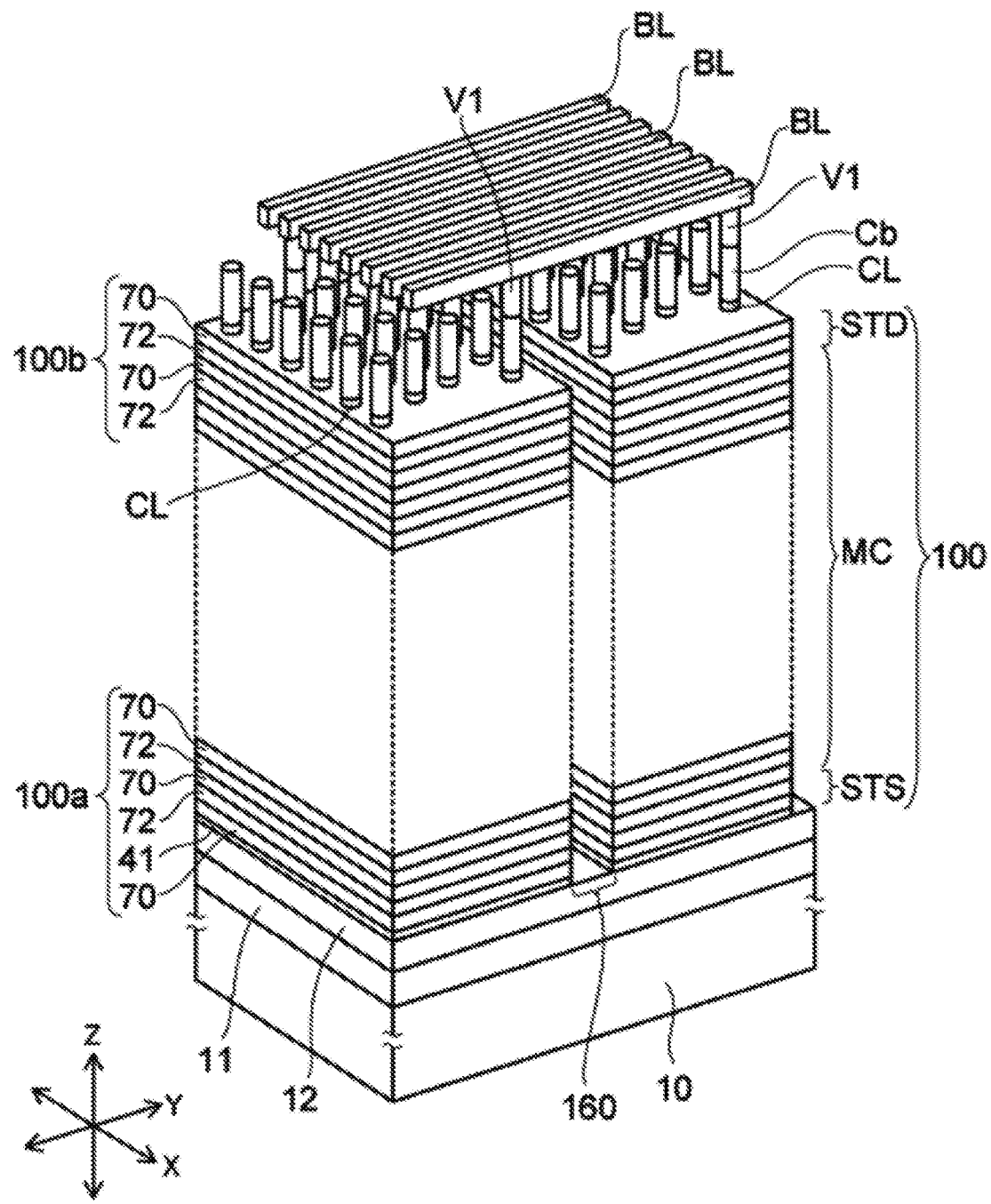
FIG. 24 is a perspective view illustrating another example of a memory cell array according to each embodiment.

FIG. 24 is a perspective view illustrating another example of a memory cell array according to each embodiment.

As illustrated in FIG. 24, in another example of the memory cell array, a first under layer 11 and a second under layer 12 are provided between a substrate 10 and a first stacked body 100a. The first under layer 11 is provided between the substrate 10 and the second under layer 12, and the second under layer 12 is provided between the first under layer 11 and the first stacked body 100a.

The second under layer 12 is a semiconductor layer or a conductive layer. Alternatively, the second under layer 12 may include a stacked body of the semiconductor layer and the conductive layer. The first under layer 11 includes transistors and wiring which form a control circuit.

The lower end of the semiconductor layer 20 of the first columnar portion CL1 is in contact with the second under layer 12, and the second under layer 12 is connected to a control circuit. Accordingly, the lower end of the semiconductor layer 20 of the first columnar portion CL1 is electrically connected to the control circuit through the second under layer 12. That is, the second under layer 12 may be used as a source layer.

The stacked body 100 is separated into a plurality of blocks (or finger portions) in the Y direction by dividing sections 160. The dividing section 160 is an insulating layer, and does not include wirings.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein maybe made without departing from the spirit of the inventions. The accompanying claims and their equivalents are intended to cover such forms or modifications as would fall within the scope and spirit of the inventions.

What is claimed is:

1. A semiconductor device comprising:
   an under layer;
   a first stacked body located over the under layer, comprising a plurality of first conductive layers stacked one over the other in a first direction away from the under layer with first insulating layers interposed therebetween;
   a first columnar portion comprising a first semiconductor layer extending in the first stacked body in the first direction, and a first memory layer located between the first semiconductor layer and the plurality of first conductive layers;

a second stacked body located over the first stacked body, comprising a plurality of second conductive layers stacked one over the other in the first direction with second insulating layers interposed therebetween;

a second columnar portion comprising a second semiconductor layer extending in the second stacked body in the first direction, and a second memory layer located between the second semiconductor layer and the plurality of second conductive layers;

an intermediate layer provided between the first stacked body and the second stacked body; and a joining portion located between the first columnar portion and the second columnar portion within the intermediate layer, and including a third semiconductor layer continuous from the first semiconductor layer to the second semiconductor layer, wherein the first columnar portion has a first diameter, and the second columnar portion has a second diameter different from the first diameter, each of the plurality of first conductive layers has a first film thickness, and each of the plurality of second conductive layers has a second film thickness different from the first film thickness, and the joining portion has a third diameter larger than the first diameter and the second diameter.

2. The semiconductor device according to claim 1, wherein the first diameter is smaller than the second diameter, and the first film thickness is smaller than the second film thickness.

3. The semiconductor device according to claim 1, wherein the first diameter is larger than the second diameter, and the first film thickness is larger than the second film thickness.

4. The semiconductor device according to claim 1, wherein
the sidewall of each of the first columnar portion and the second columnar portion has a bow shape,
the first diameter is the diameter of the uppermost layer of the first columnar portion, and
the second diameter is the diameter of the uppermost layer of the second columnar portion.

5. The semiconductor device according to claim 1, wherein
the sidewall of each of the first columnar portion and the second columnar portion has a bow shape,
the first diameter is the diameter of the lowermost layer of the first columnar portion, and
the second diameter is the diameter of the lowermost layer of the second columnar portion.

6. The semiconductor device according to claim 1, wherein
the sidewall of each of the first columnar portion and the second columnar portion has a bow shape,
the first diameter is a diameter between the uppermost layer and the lowermost layer of the first columnar portion, and
the second diameter is a diameter between the uppermost layer and the lowermost layer of the second columnar portion.

7. The semiconductor device according to claim 6, wherein
the first diameter is the largest diameter of the first columnar portion, and
the second diameter is the largest diameter of the second columnar portion.

8. The semiconductor device according to claim 1, wherein the intermediate layer has a third film thickness larger than the sum of the first film thickness and the second film thickness.

9. The semiconductor device according to claim 1, wherein the intermediate layer is an insulating layer.

10. The semiconductor device according to claim 1, wherein the joining portion includes a layer extending continuously from the first memory layer to the second memory layer.

11. The semiconductor device according to claim 1, wherein the first insulating layers, the second insulating layers, and the intermediate layer comprise the same material.

12. A semiconductor device comprising:
an under layer;
a first stacked body located over the under layer, comprising a plurality of first conductive layers stacked one over the other in a first direction away from the under layer with first insulating layers interposed therebetween;
a first columnar portion comprising a first semiconductor layer extending in the first stacked body in the first direction, and a first memory layer located between the first semiconductor layer and the plurality of first conductive layers;
a second stacked body located over the first stacked body, comprising a plurality of second conductive layers stacked one over the other in the first direction with second insulating layers interposed therebetween;
a second columnar portion comprising a second semiconductor layer extending in the second stacked body in the first direction, and a second memory layer located between the second semiconductor layer and the plurality of second conductive layers;
an intermediate layer provided between the first stacked body and the second stacked body; and
a joining portion located between the first columnar portion and the second columnar portion within the intermediate layer, and including a third semiconductor layer continuous from the first semiconductor layer to the second semiconductor layer, wherein
the first columnar portion has a first diameter, and the second columnar portion has a second diameter different from the first diameter,
each of the plurality of first conductive layers has a first film thickness, and each of the plurality of second conductive layers has a second film thickness different from the first film thickness, and
the intermediate layer has a third film thickness larger than the sum of the first film thickness and the second film thickness.

13. The semiconductor device according to claim 12, wherein the first diameter is smaller than the second diameter, and the first film thickness is smaller than the second film thickness.

14. The semiconductor device according to claim 12, wherein the first diameter is larger than the second diameter, and the first film thickness is larger than the second film thickness.

15. The semiconductor device according to claim 12, wherein
the sidewall of each of the first columnar portion and the second columnar portion has a bow shape, the first diameter is the diameter of the uppermost layer of the first columnar portion, and the second diameter is the diameter of the uppermost layer of the second columnar portion.

16. The semiconductor device according to claim 12, wherein the sidewall of each of the first columnar portion and the second columnar portion has a bow shape, the first diameter is the diameter of the lowermost layer of the first columnar portion, and the second diameter is the diameter of the lowermost layer of the second columnar portion.

17. The semiconductor device according to claim 12, wherein the sidewall of each of the first columnar portion and the second columnar portion has a bow shape, the first diameter is a diameter between the uppermost layer and the lowermost layer of the first columnar portion, and the second diameter is a diameter between the uppermost layer and the lowermost layer of the second columnar portion.

18. The semiconductor device according to claim 17, wherein the first diameter is the largest diameter of the first columnar portion, and the second diameter is the largest diameter of the second columnar portion.

19. The semiconductor device according to claim 12, wherein the intermediate layer is an insulating layer.

20. The semiconductor device according to claim 12, wherein the joining portion includes a layer extending continuously from the first memory layer to the second memory layer.

* * * * *